(12) United States Patent  
Yamazaki

(10) Patent No.: US 7,534,977 B2  
(45) Date of Patent: May 19, 2009

(54) HEAT TREATMENT APPARATUS AND METHOD OF MANUFACTURING A SEMICONDUCTOR DEVICE

(75) Inventor: Shunpei Yamazaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 308 days.

(21) Appl. No.: 10/021,708

(22) Filed: Dec. 19, 2001

(65) Prior Publication Data  
US 2002/0084261 A1    Jul. 4, 2002

(30) Foreign Application Priority Data  
Dec. 28, 2000    (JP)    ............... 2000-403268

(51) Int. Cl.  
F24B 5/14    (2006.01)  
A21B 2/00    (2006.01)

(52) U.S. Cl. ..................... 219/390; 392/416  
(58) Field of Classification Search ............... 219/390, 219/405, 411; 392/416, 418; 118/724, 725, 118/501  
See application file for complete search history.

(56) References Cited

U.S. PATENT DOCUMENTS

| | | | |
|---|---|---|---|
| 3,612,939 A | | 10/1971 | Rabinowitz |
| 5,006,695 A | * | 4/1991 | Elliott ................ 219/494 |
| 5,219,786 A | * | 6/1993 | Noguchi ............... 438/5 |
| 5,444,217 A | | 8/1995 | Moore et al. |
| 5,508,532 A | | 4/1996 | Teramoto |
| 5,529,937 A | | 6/1996 | Zhang et al. |
| 5,530,265 A | | 6/1996 | Takemura |
| 5,643,826 A | | 7/1997 | Ohtani et al. |
| 5,648,277 A | | 7/1997 | Zhang et al. |
| 5,654,203 A | | 8/1997 | Ohtani et al. |
| 5,712,495 A | | 1/1998 | Suzawa |

(Continued)

FOREIGN PATENT DOCUMENTS

EP    0 651 431    5/1995

(Continued)

OTHER PUBLICATIONS

G. Radnoczi et al., *Al Induced Crystallization of α-Si*, J. Appl. Phys., vol. 69, No. 9, May 1, 1991, pp. 6394-6399.

(Continued)

*Primary Examiner*—Sang Y Paik  
(74) *Attorney, Agent, or Firm*—Eric J. Robinson; Robinson Intellectual Property Law Office, P.C.

(57) ABSTRACT

A heat treatment apparatus of the present invention includes a reaction tube, an exhaust unit for reducing the pressure in the reaction tube, a unit for introducing gas for heating or cooling a subject substrate disposed in the reaction tube, a light source for heating the subject substrate disposed in the reaction tube, and a unit for switching on/off the light source in a pulse form. Furthermore, the subject substrate is heated by a light source, using a first unit for heating the subject substrate by switching on/off the light source in a pulse form with a cycle of one second or shorter, and a second unit for heating the subject substrate by switching on/off the light source in a pulse form with a cycle of one second or longer.

88 Claims, 14 Drawing Sheets

U.S. PATENT DOCUMENTS

| | | | |
|---|---|---|---|
| 5,719,065 | A | 2/1998 | Takemura et al. |
| 5,731,637 | A | 3/1998 | Hori et al. |
| 5,739,549 | A | 4/1998 | Takemura et al. |
| 5,754,260 | A | 5/1998 | Ooi et al. |
| 5,771,110 | A | 6/1998 | Hirano et al. |
| 5,773,329 | A | 6/1998 | Kuo |
| 5,820,650 | A | 10/1998 | Yamazaki |
| 5,923,962 | A | 7/1999 | Ohtani et al. |
| 5,945,711 | A | 8/1999 | Takemura et al. |
| 5,946,562 | A | 8/1999 | Kuo |
| 5,956,579 | A | 9/1999 | Yamazaki et al. |
| 6,060,697 | A * | 5/2000 | Morita et al. ............... 219/483 |
| 6,087,245 | A | 7/2000 | Yamazaki et al. |
| 6,105,274 | A | 8/2000 | Ballantine et al. |
| 6,140,166 | A | 10/2000 | Ohtani et al. |
| 6,140,668 | A | 10/2000 | Mei et al. |
| 6,143,630 | A | 11/2000 | Tregilgas |
| 6,156,628 | A | 12/2000 | Ohnuma et al. |
| 6,162,667 | A | 12/2000 | Funai et al. |
| 6,187,616 | B1 | 2/2001 | Gyoda |
| 6,201,585 | B1 | 3/2001 | Takano et al. |
| 6,285,042 | B1 | 9/2001 | Ohtani et al. |
| 6,306,694 | B1 | 10/2001 | Yamazaki et al. |
| 6,333,493 | B1 | 12/2001 | Sakurai et al. |
| 6,335,541 | B1 | 1/2002 | Ohtani et al. |
| 6,342,322 | B1 | 1/2002 | Kakinuma et al. |
| 6,399,921 | B1 * | 6/2002 | Johnsgard et al. ........... 219/405 |
| 6,414,280 | B1 * | 7/2002 | Nishitani et al. ............. 219/411 |
| 6,461,439 | B1 * | 10/2002 | Granneman et al. ......... 118/724 |
| 6,500,704 | B1 | 12/2002 | Hirano et al. |
| 6,594,446 | B2 * | 7/2003 | Camm et al. ................. 392/416 |
| 6,599,818 | B2 | 7/2003 | Dairiki |
| 6,759,313 | B2 | 7/2004 | Yamazaki et al. |
| 6,790,714 | B2 | 9/2004 | Hirano et al. |
| 7,084,052 | B2 | 8/2006 | Hirano et al. |
| 2001/0005019 | A1 | 6/2001 | Ishikawa |
| 2001/0005606 | A1 | 6/2001 | Tanaka et al. |
| 2001/0009283 | A1 | 7/2001 | Arao et al. |
| 2001/0015441 | A1 | 8/2001 | Kawasaki et al. |
| 2002/0053670 | A1 | 5/2002 | Ohtani et al. |
| 2002/0068421 | A1 | 6/2002 | Yamazaki et al. |
| 2002/0068422 | A1 | 6/2002 | Dairiki et al. |
| 2002/0084261 | A1 | 7/2002 | Yamazaki |
| 2004/0077185 | A1 | 4/2004 | Dairiki |
| 2004/0241967 | A1 | 12/2004 | Yamazaki et al. |

FOREIGN PATENT DOCUMENTS

| | | |
|---|---|---|
| EP | 1 158 580 | 11/2001 |
| JP | 61-251128 | 11/1986 |
| JP | 05-206048 | 8/1993 |
| JP | 07-130652 | 5/1995 |
| JP | 07-183540 | 7/1995 |
| JP | 09-074201 | 3/1997 |
| JP | 10-070077 | 3/1998 |
| JP | 2000-133612 | 5/2000 |
| JP | 2000-234165 | 8/2000 |

OTHER PUBLICATIONS

T. Tsutsui et al., *Electroluminescence in Organic Thin Films*, Photochemical Processes in Organized Molecular Systems, Jan. 1, 1991, pp. 437-450.

M.A. Baldo et al., *Highly Efficient Phosphorescent Emission from Organic Electroluminescent Devices*, Nature, vol. 395, Sep. 10, 1998, pp. 151-154.

M.A. Baldo et al., *Very High-Efficiency Green Organic Light-Emitting Devices Based on Electrophosphorescence*, Appl. Phys. Lett., vol. 75 No. 1, Jul. 5, 1999, pp. 4-6.

T. Tsutsui et al., *High Quantum Efficiency in Organic Light-Emitting Devices with Iridium-Complex as a Triplet Emissive Center*, Jpn. J. Appl. Phys., vol. 38, Part 2, No. 12B, Dec. 15, 1999, pp. L1502-L1504.

M.A. Crowder et al., *Low-Temperature Single-Crystal Si TFT's Fabricated on Si Films Processed Via Sequential Lateral Solidification*, IEEE Electron Device Letters, vol. 19, No. 8, Aug. 1, 1998, pp. 306-308.

* cited by examiner

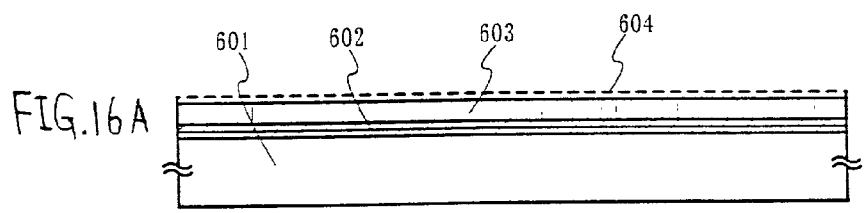
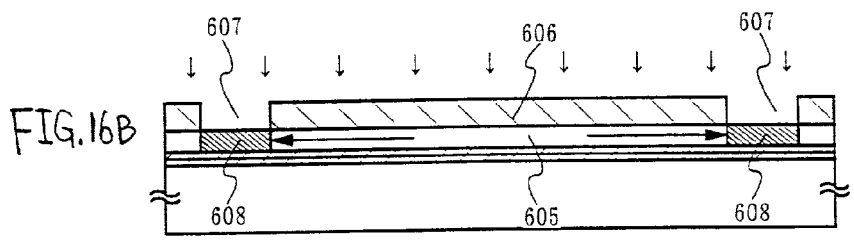
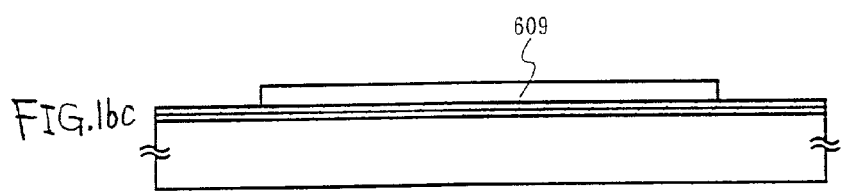
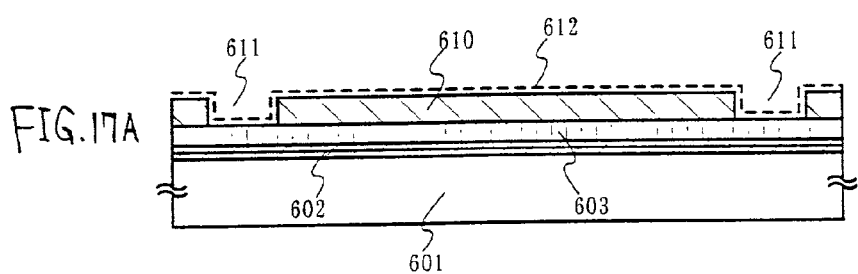
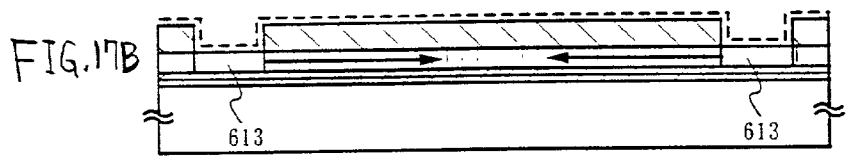
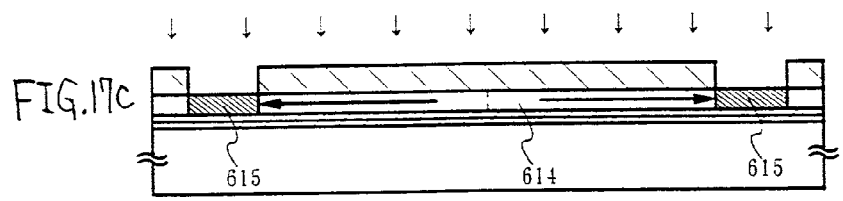
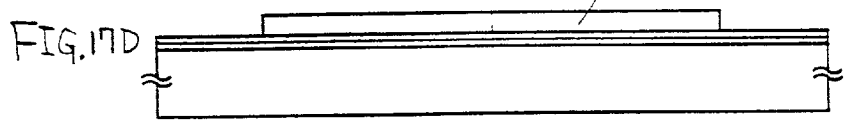

HEAT TREATMENT APPARATUS AND METHOD OF MANUFACTURING A SEMICONDUCTOR DEVICE

BACKGROUND OF THE INVENTION

1. Field of the Invention

The present invention relates to a heat treatment apparatus and a method of manufacturing a semiconductor device using the heat treatment apparatus. In particular, the present invention relates to a heat treatment apparatus for heating a subject substrate with radiation from a light source such as a lamp, and a method of manufacturing a semiconductor device using the heat treatment apparatus is applied to a semiconductor device using a semiconductor film having a crystalline structure.

2. Description of the Related Art

Heat treatment is a process required for activating impurities added to a semiconductor and for forming contact between a semiconductor and an electrode. In particular, a hot-wall type horizontal or vertical annealing furnace is known as a typical heat treatment apparatus.

However, regarding a monolithic integrated circuit manufactured by using a semiconductor, there is an increasing demand for very high processing precision along with miniaturization. In particular, in order to form a shallow junction, a heat treatment technique is required for minimizing diffusion of impurities. It is considered that a method requiring a considerable time for heating and cooling as in an annealing furnace is not necessarily appropriate.

In contrast, as a heat treatment technique of rapid heating and rapid cooling, rapid thermal anneal (hereinafter, referred to as "RTA") has been developed, and a heat treatment method has been developed, which is conducted by instantaneously supplying heat within tens of seconds to several microseconds. RTA is known as a method of rapidly heating a substrate mainly using an infrared lamp, thereby conducting heat treatment in a short period of time.

An integrated circuit is manufactured not only by using a semiconductor substrate such as a silicon wafer, but also by using a thin film transistor (hereinafter, referred to as "TFT") formed on a substrate made of glass, quartz, or the like. Although depending upon the structure and manufacturing method, a TFT having more satisfactory electrical characteristics can be obtained by forming an active layer constituting a channel with a semiconductor film having a crystalline structure (hereinafter, referred to as a "crystalline semiconductor film"), rather than by forming the active layer constituting a channel with an amorphous semiconductor film.

When a quartz substrate is used, a resultant TFT can withstand heat treatment at 900° C., and a manufacturing technique based on a semiconductor substrate can be applied. On the other hand, in the case where the size of a substrate is enlarged as in a liquid crystal display device, the use of an inexpensive glass substrate is required for reducing a cost. As a glass substrate commercially available or mass-produced for electronic equipment such as a liquid crystal display device, aluminoborosilicate glass, barium borosilicate glass, or the like with the concentration of contained alkaline elements reduced is used. However, the heat resistant temperature of such a glass substrate is at most about 650° C., so that the upper limit of a heat treatment temperature is inevitably determined in the vicinity of that temperature.

For example, an amorphous silicon film requires heat treatment at 600° C. or higher for several to tens of hours for crystallization. In order to shorten a time for crystallization, a higher temperature is required. However, increasing a heat treatment temperature more than a strain point causes irreversible deformation of a glass substrate, which is not a practical method. Therefore, according to a laser annealing method to be adopted for that purpose, laser light with a high energy density condensed by an optical system is radiated for crystallization. Typically, an excimer laser that pulse-oscillates is used. In the case of an excimer laser, although an irradiation time of laser light is tens of nanoseconds, a semiconductor film melts to be in a liquid phase state and then, crystallized.

Although it is attempted to crystallize an amorphous semiconductor film by an RTA method, a longer heating time is required, compared with the laser annealing method. Furthermore, in terms of a heating temperature, crystallization by the RTA method has a problem. More specifically, crystallization by the RTA method is solid-phase growth; therefore, unlike the laser annealing method, satisfactory crystal cannot be obtained, and a substrate temperature is considerably increased. This requires that a quartz substrate having heat resistance be used. In the case of a glass substrate, it has been confirmed that a substrate temperature is increased by heating with lamp light irradiated for crystallization for tens of seconds, and strain and deformation are caused.

Crystallization by heat treatment of a semiconductor film and activation of added impurities have an optimum temperature range. However, reaction proceeds more rapidly with heating at a higher temperature, and heat treatment is conducted in a shorter period of time. Even with the RTA method, in the case of using a glass substrate with low heat resistance, treatment conditions for heating a glass substrate at a heat resistant temperature or higher cannot be applied. Therefore, it is required to prolong a treatment time, instead of lowering a treatment temperature. However, the RTA is based on a single wafer treatment, so that an increase in a heat treatment time causes a decrease in a throughput.

The RTA method is capable of conducting heat treatment up to a high temperature in a short period of time. Furthermore, although using a single wafer treatment, the RTA method potentially has higher treatment ability, compared with the furnace annealing method. However, according to the conventional RTA method, it is required to increase a heating temperature, instead of shortening a heating time. Therefore, in order to obtain desired effects in activation and gettering process, it is required to conduct heat treatment at a strain point or higher of glass, and in some cases, a softening point or higher of glass. For example, with heat treatment at 800° C. for 60 seconds for the purpose of gettering process, a glass substrate is curved and deformed with its dead weight.

The use of an annealing furnace for a batch treatment is also considered. However, in this case, an apparatus is enlarged with an increase in size of a subject substrate. This causes an increase in power consumption due to uniform heating in a furnace of large capacity, as well as an increase in a setting area.

SUMMARY OF THE INVENTION

Therefore, with the foregoing in mind, it is an object of the present invention to provide a method of activating an impurity element added to a semiconductor film by heat treatment in a short period of time without deforming a substrate in a manufacturing process of a semiconductor device using a substrate with low heat resistance made of glass or the like and of gettering of a semiconductor film, and a heat treatment apparatus realizing such heat treatment.

In order to solve the above-mentioned problems, the heat treatment apparatus of the present invention has a configuration including a reaction tube, a unit for introducing gas for heating/cooling a subject substrate disposed in the reaction tube, a light source for heating a subject substrate disposed in the reaction tube, and a unit for switching on/off the light source in a pulse form. The heat treatment apparatus of the present invention has another configuration including a reaction rube, a unit for introducing gas heated or cooled to a temperature equal to or lower than a room temperature into a subject substrate disposed in the reaction tube, a light source for heating the subject substrate disposed in the reaction tube, and a unit for switching on/off the light source in a pulse form. In addition to such a configuration, an exhaust unit for reducing the pressure in the reaction tube may be provided.

Furthermore, heating of the subject substrate by a light source is conducted by a first unit for heating the subject substrate by switching on/off the light source in a pulse form with a cycle of one second or shorter and a second unit for heating the subject substrate by switching on/off the light source with a cycle of one second or longer. This is realized by varying the configuration of a power source circuit for switching on/off a light source while using a common light source.

As a light source, a halogen lamp, a metal halide lamp, a high-pressure mercury lamp, a high-pressure sodium lamp, a xenon lamp, or the like can be used. In any case, a lamp that emits radiation light containing a wavelength band absorbed by a subject substrate is used. For example, if a subject substrate is a silicon film, a halogen lamp, a metal halide lamp, or the like, emitting light in a wavelength band of 0.5 to 1.5 μm, is suitable.

Furthermore, as gas introduced into the reaction tube, inactive gas such as helium, argon, krypton, and xenon is used so as to prevent reaction with a subject substrate.

Furthermore, a method of manufacturing a semiconductor device of the present invention using the heat treatment apparatus with the above-mentioned configuration includes supplying heated gas into the reaction tube, and heating a subject substrate disposed in the reaction tube by switching on/off a light source provided outside of the reaction tube in a pulse form. Furthermore, after heating is completed, gas cooled to a temperature equal to or lower than a room temperature is supplied into the reaction tube to cool the subject substrate, whereby a throughput can be enhanced. Furthermore, the similar manufacturing method is also applicable while the reaction tube is kept under a reduced pressure. In the present invention, a semiconductor device refers to all the devices capable of functioning using semiconductor characteristics.

According to a method of heat treatment of a subject substrate, in addition to heating of the subject substrate with heated inactive gas, a heating process is also adopted, which is conducted by a first stage of heating the subject substrate by switching on/off a light source with a cycle of one second or shorter and a second stage of heating the subject substrate by switching on/off the light source in a pulse form with a cycle of one second or longer. The first stage is conducted for the purpose of pre-heating the subject substrate to a predetermined temperature, and the second stage is conducted for performing a desired heat treatment such as crystallization, activation, and gettering.

As a subject substrate, a semiconductor film formed on a substrate made of glass, quartz, or the like is used. In the semiconductor film, an impurity region with impurities of one conductivity type added thereto may be formed. Furthermore, a gate insulating film, a gate electrode, and the like may be formed.

Heat treatment using the heat treatment apparatus of the present invention is roughly divided into three stages: preliminary heating, heat treatment, and a cooling treatment, as shown in FIG. 6. In the preliminary heating, a subject substrate is heated with inactive gas heated by a heating unit. A heating temperature is about 300° C. to 500° C., and a light source is switched on/off in a pulse form while the heating temperature is kept, whereby heat treatment is conducted. Each light-emitting time of the light source is 0.1 to 60 seconds, preferably 0.1 to 20 seconds, and light is radiated from the light source a plurality of times. Alternatively, light from the light source is radiated in a pulse form so that the retention time of the highest temperature of a semiconductor film is 0.5 to 5 seconds. Thereafter, in the cooling treatment, the subject substrate is cooled to 200° C. or lower with inactive gas supplied through a cooling unit and cooled to a temperature equal to or lower than a room temperature.

The preliminary heating may be conducted by switching on/off a light source with a cycle of one second or shorter to irradiate pulse light a plurality of times as shown in FIG. 7, as well as by using heated inactive gas. A pulse forming network circuit is used for switching on/off of the light source, thereby efficiently supplying a pulse-shaped large current to the light source. Needless to say, preliminary heating may be conducted by combining heating with pulse light with heating with heated inactive gas.

These and other advantages of the present invention will become apparent to those skilled in the art upon reading and understanding the following detailed description with reference to the accompanying figures.

BRIEF DESCRIPTION OF THE DRAWINGS

In the accompanying drawings:

FIGS. 16A to 16C illustrate a method of manufacturing a crystalline semiconductor film according to the present invention;

FIGS. 17A to 17D illustrate a method of manufacturing a crystalline semiconductor film according to the present invention;

DESCRIPTION OF THE PREFERRED EMBODIMENTS

Figure 1:
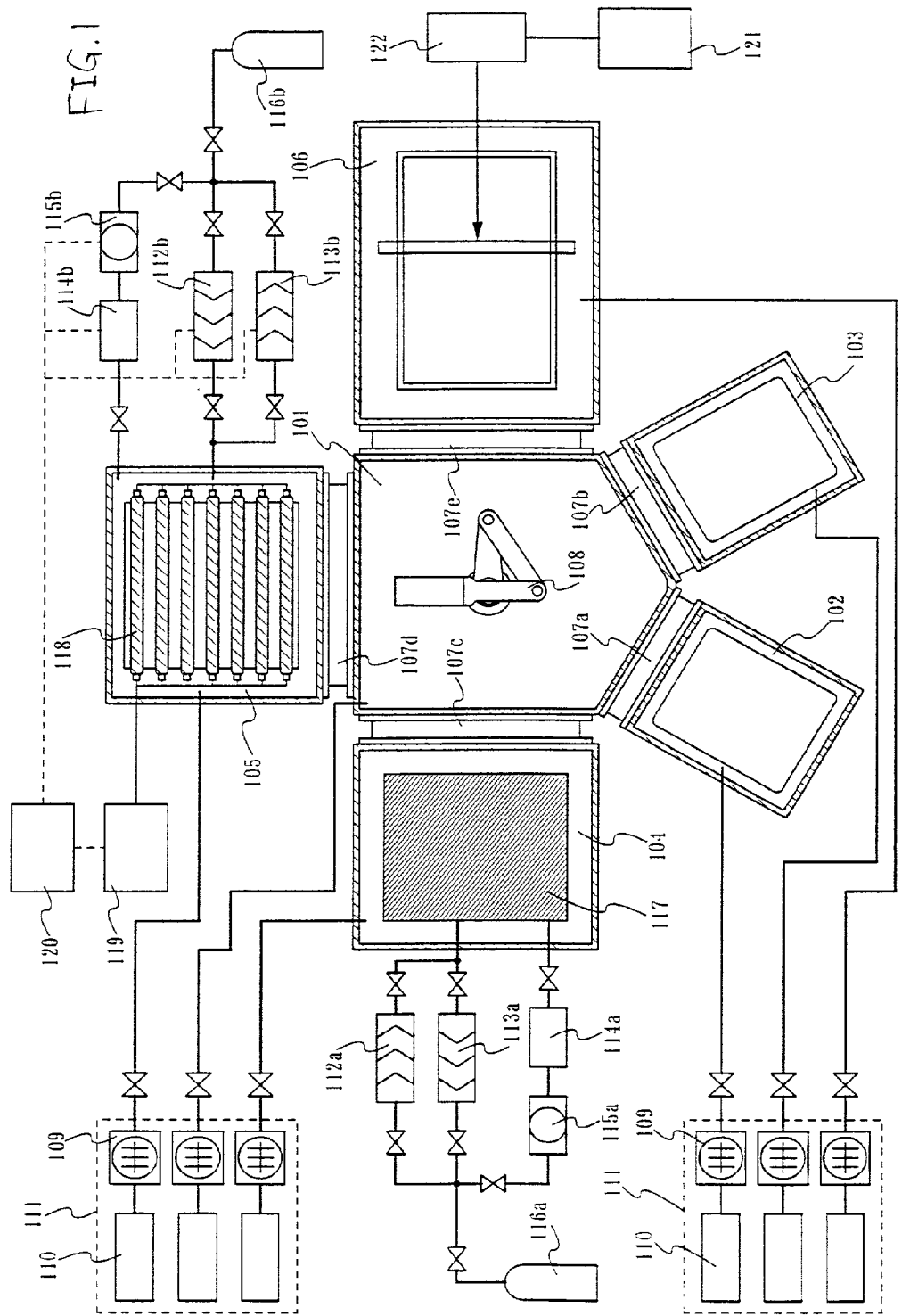
FIG. 1 is a view illustrating a configuration of a heat treatment apparatus of the present invention.

Hereinafter, the present invention will be described in detail by way of illustrative embodiments with reference to the drawings. The configuration of the heat treatment apparatus of the present invention will be described with reference to FIG. 1. The heat treatment apparatus shown in FIG. 1 includes a load chamber 102, an unload chamber 103, a preliminary heating chamber 104, a heat treatment chamber 105, and a laser treatment chamber 106 around a transfer chamber 101 provided with a transfer unit 108 for transferring a substrate. The chambers can be kept under a reduced pressure by an exhaust unit 111. The chambers are also connected to the transfer chamber 101 via gates 107a to 107e.

The heat treatment chamber 105 is provided with a light source 118 that is switched on/off by a power source unit 119. Furthermore, as the exhaust unit 111 for reducing the pressure in the heat treatment chamber 105, a turbo molecular pump 109 and a dry pump 110 are provided. It is appreciated that other vacuum pumps can be used as the exhaust unit 111.

As gas introduced into the heat treatment chamber 105, inactive gas such as nitrogen, helium, argon, krypton, and neon are used. In any case, it is desirable that the gas is a medium with a small absorptivity with respect to radiation heat of the light source 118. The gas is supplied from a cylinder 116b. As a unit for supplying the gas, there are provided a heating unit 112b and a cooling unit 113b for gas before introducing the gas into the heat treatment chamber 105. The heating unit 112b and the cooling unit 113b are disposed for heating or cooling a subject substrate, disposed in the heat treatment chamber 105. The gas is introduced into the heat treatment chamber 105 via either one of the paths. The gas supplied to the heat treatment chamber 105 is circulated by a circulator 115b to cool a substrate. In this case, it is desirable that a purifier 114b is provided at some midpoint so as to maintain the purity of the gas. As the purifier 114b, a getter material may be used, or a cold trap made of liquid nitrogen may be used.

The light source 118 is switched on/off in a pulse form by the power source unit 119. Switching on/off of the light source 118 and the flow rate of the gas flowing through the heat treatment chamber 105 are varied in synchronization. The subject substrate is rapidly heated by switching on/off the light source 118. The subject substrate is heated up to a set temperature (e.g., 1150° C.) at a heating rate of 100° C. to 200° C./sec. The set temperature is detected by a temperature detector disposed in the vicinity of the subject substrate. As the temperature detector, a thermopile, a thermocouple, or the like is used.

For example, if the subject substrate is heated at a heating rate of 150° C./sec., the subject substrate can be heated up to 1100° C. in about 7 seconds or less. Thereafter, the subject substrate is kept at a set temperature for a predetermined period of time, and the light source is switched off. The subject substrate is kept for 0.5 to 5 seconds. Thus, the continuous lighting time of the light source is in a range of 0.1 seconds to shorter than 90 seconds.

As the light source, a halogen lamp, a metal halide lamp, a high-pressure mercury lamp, a high-pressure sodium lamp, a xenon lamp, and the like can be used. Lighting of the light source 118 is conducted in first and second stages. In the first stage, the subject substrate is heated by switching on/off the light source 118 in a pulse form with a cycle of one second or shorter. In the second stage, the substrate is heated by switching on/off the light source in a pulse form with a cycle of one second or longer. The first stage is conducted for the purpose of a preliminary heat treatment of the subject substrate, in which the subject substrate is heated up to about 200° C. to 400° C. The second stage is conducted for the purpose of heat treatment, in which the subject substrate is heated up to a desired temperature by prolonging the lighting time of the light source 118.

Lighting of the light source 118 in a pulse form is conducted for selectively heating a predetermined region of the subject substrate. For example, in the case where a semiconductor film on a glass substrate is used as the subject substrate, if a halogen lamp having a strong spectrum distribution in an infrared region is used, the semiconductor film can be heated to 600° C. or higher substantially without deforming the glass substrate.

Figure 8A:
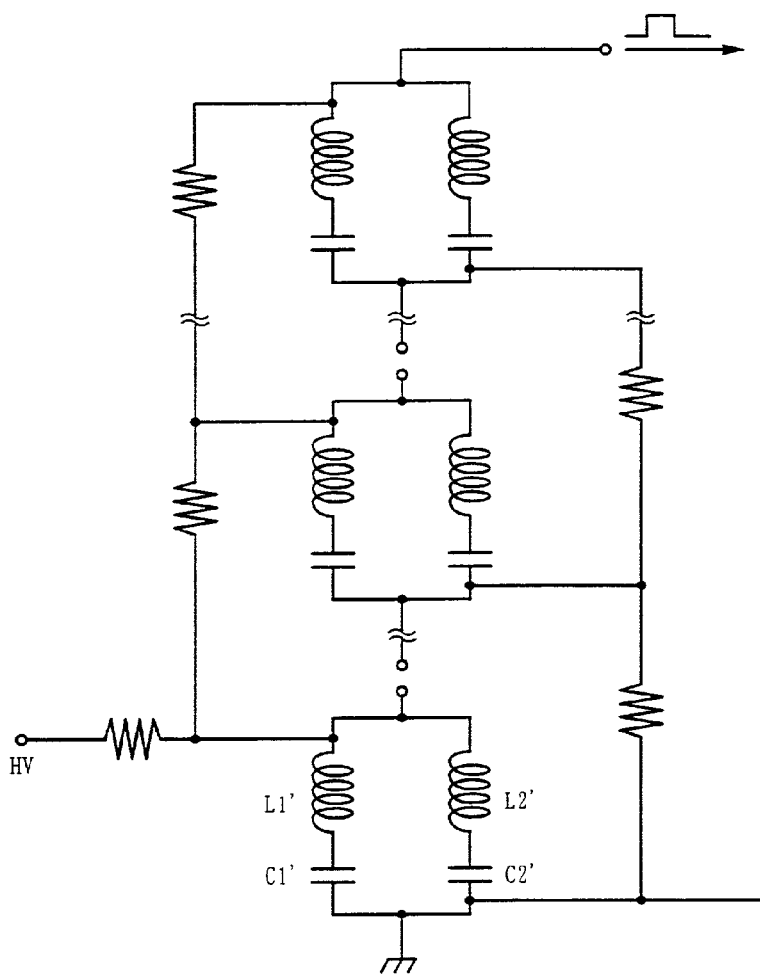
FIGS. 8A and 8B show an exemplary control circuit suitable for switching on/off a light source such as a halogen lamp in a pulse form.
Figure 8B:
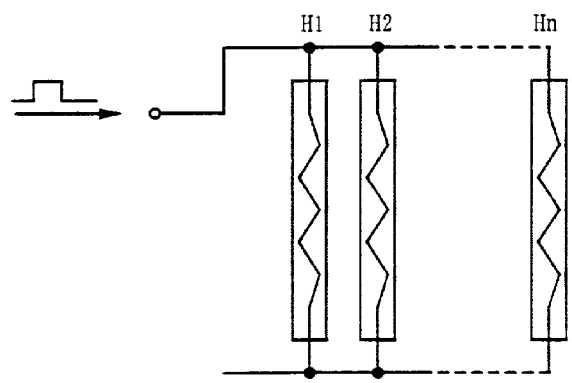

FIGS. 8A and 8B show an example of a circuit realizing discharge in a pulse form in a short cycle as in the first stage in which the subject substrate is heated by switching on/off the light source in a pulse form with a cycle of one second or shorter. FIG. 8A shows a pulse forming network circuit, which transforms a pulse wave into a square wave by adding damped oscillation with a triple cycle by L2, C2, and R to critical damping discharge by L1, C1, and R. Because of such a discharge circuit, an output with a pulse width of 10 nanoseconds to 100 milliseconds at about 10 MA is made possible. The duration time of discharge may be varied depending upon the values of L and C, and the number of connection stages. The output is supplied to light sources H1 to Hn as shown in FIG. 8B. On the other hand, the second stage in which the subject substrate is heated by switching on/off the light source in a pulse form with a cycle of one second or longer is conducted by using a battery or a flywheel generator.

Heat treatment is conducted as follows. A subject substrate is placed in the heat treatment chamber 105 kept under a reduced pressure of 13.3 Pa or lower by the exhaust unit 111. In the first stage, gas heated by the heating unit 112b is introduced into the heat treatment chamber 105, and kept at 13.3 to $1.33 \times 10^4$ Pa. The subject substrate is heated to about 200° C. to 400° C. by the introduced gas. The gas may be circulated through a path of the purifier 114b, the circulator 115b, and the heating unit 112b. In the first stage, heating may be conducted so as to switch on/off the light source 118 at a short interval with a cycle of one second or shorter. Thereafter, as the second stage, heat treatment is conducted, in which pulse light is irradiated a plurality of times for a lighting time of 1 to 60 seconds by the light source 118. After a predetermined heat treatment is completed, an introduction path of gas is changed, and gas is introduced via the cooling unit 113b. This is conducted for the purpose of cooling the subject substrate. The temperature of gas to be cooled is assumed to be from a room temperature to about a temperature of liquid nitrogen.

Thus, the heat treatment apparatus of the present invention is characterized by using gas heated to a temperature equal to or higher than a room temperature or cooled to a temperature equal to or lower than a room temperature for the purpose of shortening a time required for heating and cooling a subject substrate. Furthermore, heat treatment is conducted under a reduced pressure, whereby heat insulation is increased to enhance heat efficiency. By shortening an actual heating time, and irradiating light selectively absorbed by a semiconductor film from a light source, only the semiconductor film can be selectively heated without heating a substrate itself.

The preliminary heating chamber 104 actively heats and cools the subject substrate. In the preliminary heating chamber 104, inactive gas supplied from a cylinder 116a is heated or cooled by the heating unit 112a or the cooling unit 113a, and is sprayed onto the subject substrate. It may also be possible that the preliminary heating chamber 104 is kept under a reduced pressure by the exhaust unit 111, and the introduced gas is circulated in the purifier chamber 114b and a circulator 115a.

Furthermore, the laser treatment chamber 106 conducts heat treatment of the subject substrate with laser light. The laser treatment chamber 106 is provided with a laser oscillator 121 and an optical system 122 for irradiating the subject substrate with laser light at a predetermined energy density.

Figure 2:
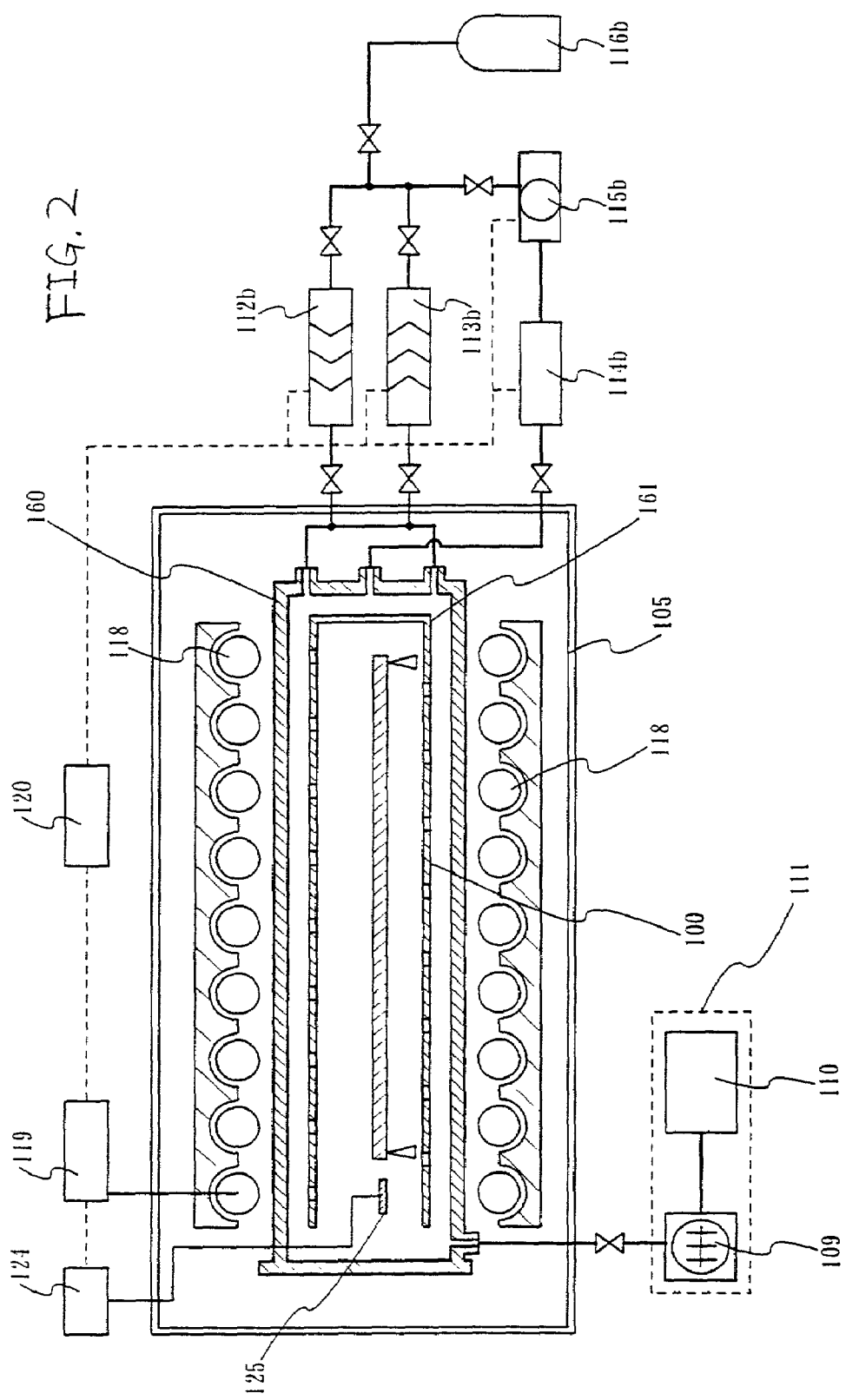
FIG. 2 is a view illustrating a configuration of a heat treatment apparatus of the present invention.

FIG. 2 illustrates the detail of the heat treatment chamber 105. The heat treatment chamber 105 is provided with a reaction tube 160 made of quartz, and a light source 118 is provided outside of the reaction tube 160. A subject substrate is placed on the reaction tube 160. In order to render a temperature distribution uniform, the subject substrate is placed on a pin. A pressure-reducing unit 111 is preferably composed of a turbo molecular pump 109 and a dry pump 111, and is used for exhausting the reaction tube 160 to keep the inside thereof under a reduced pressure. The heating temperature by the light source 118 is measured by a temperature detector 124 using a thermocouple. In the reaction tube 160, a sensor 125 such as a thermopile is provided, which indirectly monitors a heating temperature of the subject substrate.

Even with heat treatment under a reduced pressure, by using a wavelength band in which irradiation from a light source is absorbed by the subject substrate, efficient heating can be conducted. Heat treatment under a reduced pressure can reduce the concentration of oxygen, and suppress oxidation of the subject substrate.

The light source 118 is switched on/off by the power source unit 119. A computer 120 controls the operations of the power source unit 119, the heating unit 112b and cooling unit 113b for gas, the purifier 114b, and the circulator 115b in a concentrated manner.

The reaction tube 160 has a double structure, and the subject substrate is set inside an inner tube 161. Inactive gas supplied through the heating unit 112b or the cooling unit 113b is supplied between the reaction tube (outer tube) 160 and the inner tube 161, and is supplied inside the inner tube 161 through pores provided in the inner tube 161.

Figure 3:
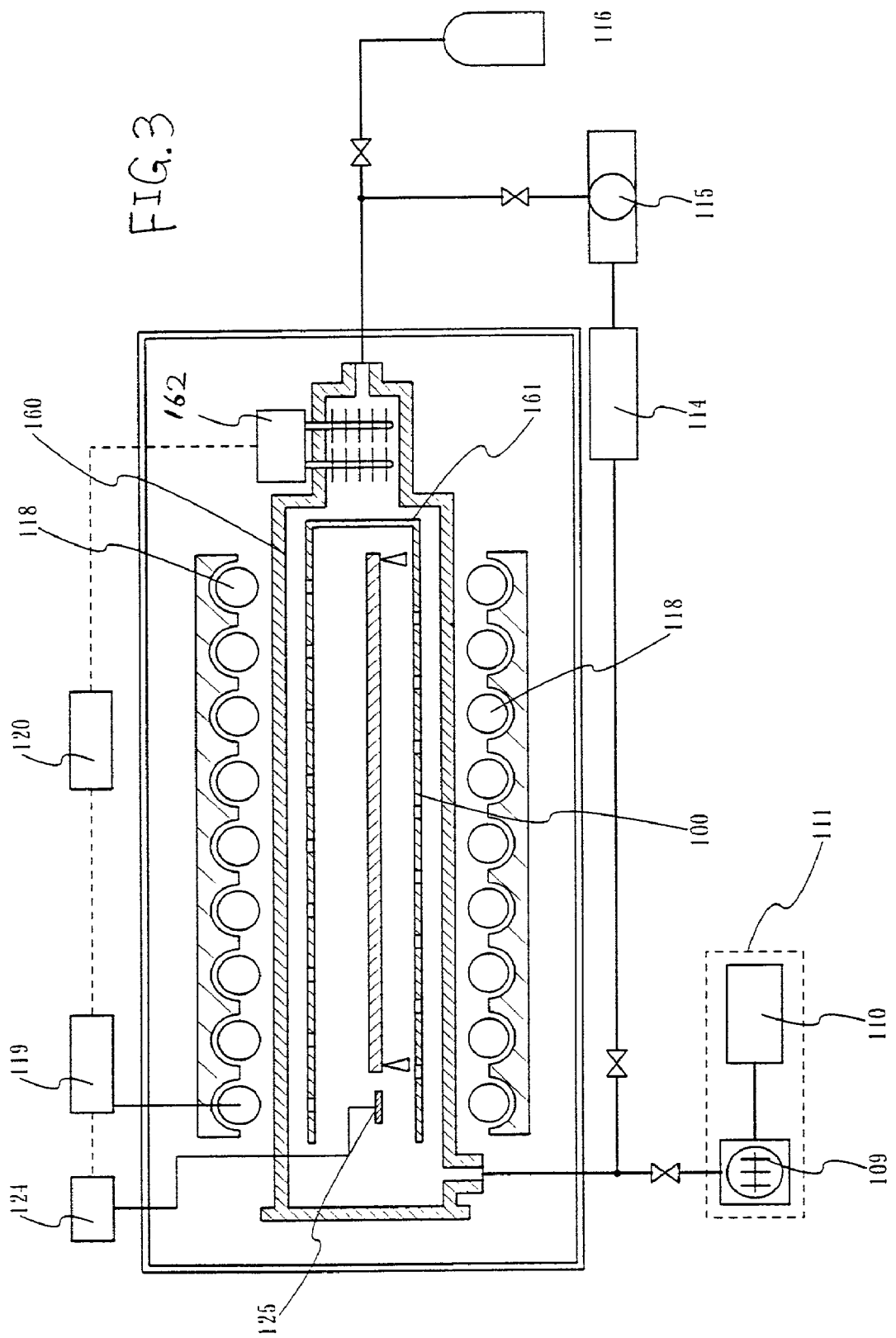
FIG. 3 is a view illustrating a configuration of a heat treatment apparatus of the present invention.

FIG. 3 shows another exemplary configuration of the heat treatment chamber 105. In this configuration, a radiator 162 is used for heating and cooing inactive gas supplied to the reaction tube 160, and the radiator 162 is connected to the reaction tube 160. The radiator 162 is connected to a heat exchanger 126 to conduct heating or cooling. The remaining configurations are the same as those in FIG. 2.

Figure 4:
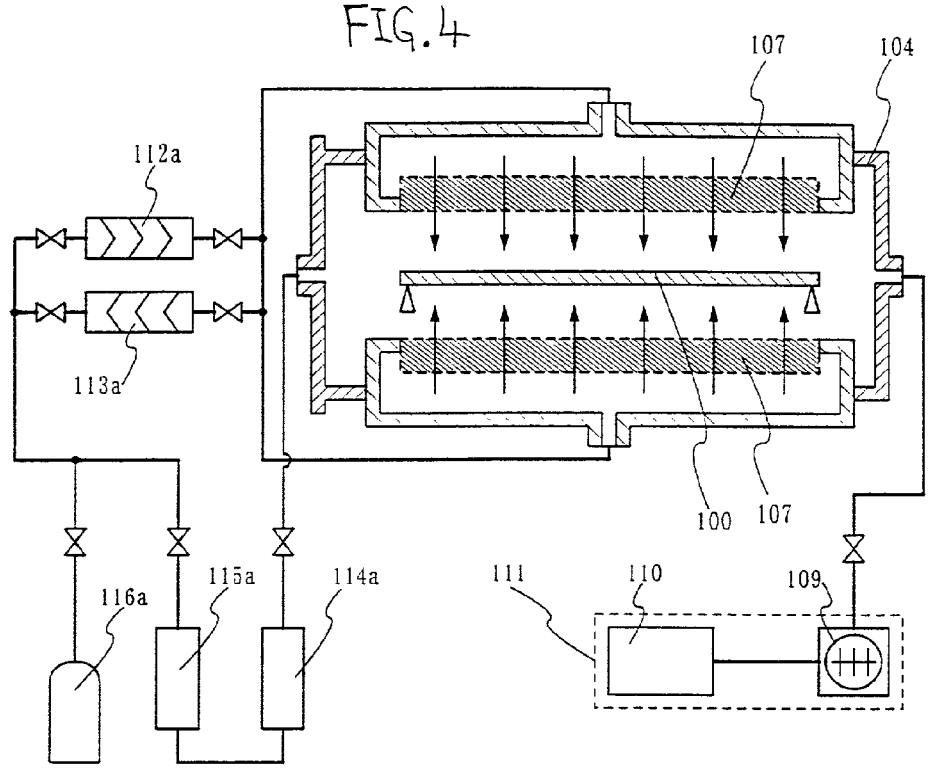
FIG. 4 is a view illustrating a configuration of a heat treatment apparatus of the present invention.

FIG. 4 shows a configuration of the preliminary heating chamber 104. In this configuration, inactive gas supplied through the heating unit 112a or the cooling unit 113a from the cylinder 116a passes through a porous material 107 to be supplied to the preliminary heating chamber 104. As the porous material 107, a shower plate provided with a number of pores may be used. In order to spray inactive gas onto a substrate 100 more uniformly, a porous material made of ceramic or the like is preferably used. The other configurations of the exhaust unit 111 etc. are as described in FIG. 1.

Figures 5A, 5B:
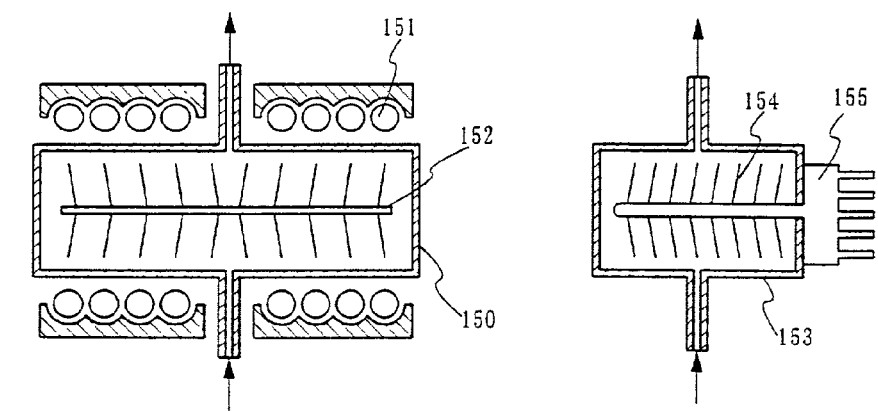
FIGS. 5A and 5B are views illustrating examples of a heating unit and a cooling unit.
Figure 6:
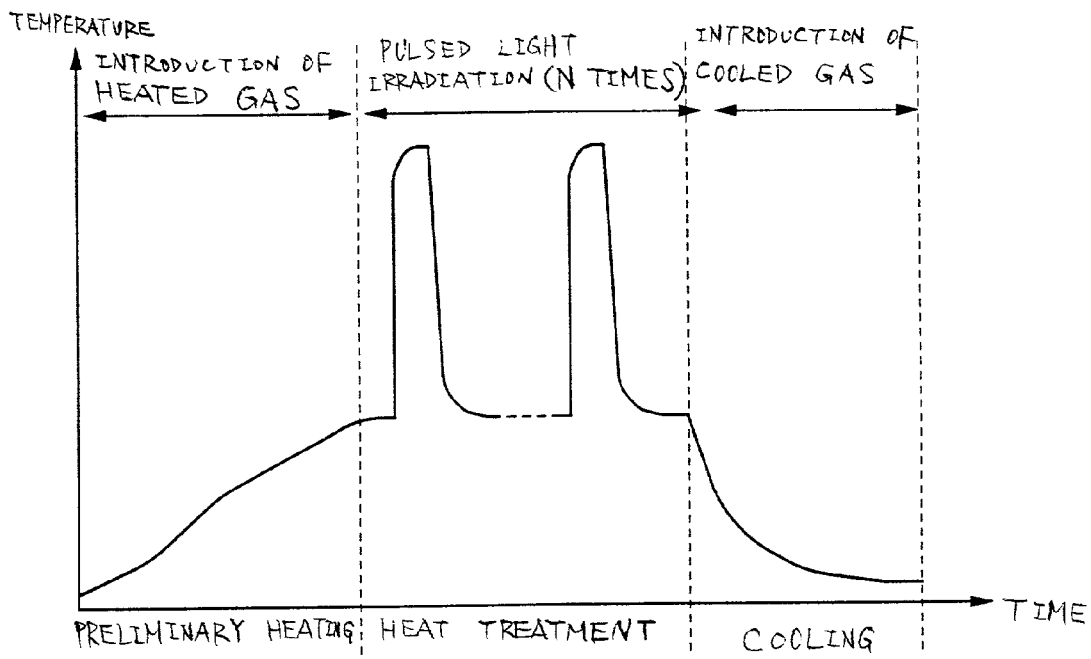
FIG. 6 is a diagram illustrating switching on/off of a light source and a change in temperature of a semiconductor substrate.
Figure 7:
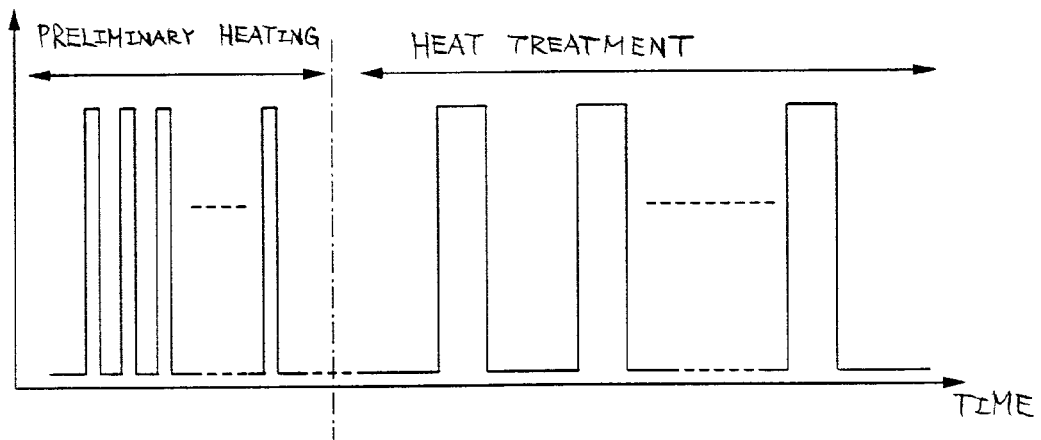
FIG. 7 is a diagram illustrating a method of a preliminary heat treatment and heat treatment by irradiation with pulse light.

FIGS. 5A and 5B show exemplary configurations of the heating unit and the cooling unit of inactive gas suitable for the heat treatment apparatus of the present invention. FIG. 5A shows an example of the heating unit, in which a fin 152 made of titanium or tungsten of high purity is provided inside of a cylinder 150 for allowing gas to pass. The cylinder 150 is made of light-transmitting quartz, and the fin 152 is heated with irradiation from a light source 151 provided outside of the cylinder 150. Gas is heated by coming into contact with the fin 152; however, by providing a heat source outside of the cylinder 150, the gas is prevented from being contaminated, and the purity of the passing gas can be maintained.

FIG. 5B shows an example of the cooling unit, in which a fin 154 made of titanium or tungsten of high purity is provided in a cylinder 153 for allowing gas to pass, and is connected to a heat exchanger 155 through a heat pie. Gas is heated by coming into contact with the fin 154.

As described above, according to the present invention, even in the case where a substrate with low heat resistance made of glass or the like is used, a method of activating an impurity element added to a semiconductor film by heat treatment in a short period of time and of conducting gettering processing of a semiconductor film, and such heat treatment can be realized. Such heat treatment can be incorporated into manufacturing processes of a semiconductor device. The configuration of the heat treatment apparatus of the present embodiment is described merely for an illustrative purpose, and the present invention is not limited thereto. The heat treatment apparatus of the present invention is characterized by using a cooling unit for a subject substrate, and having a configuration of heating of a semiconductor film by irradiation with light from a light source in a pulse form. If such a configuration is satisfied, the remaining configurations may not be particularly limited.

It is appreciated that the heat treatment apparatus of the present invention is used for heat treatment of an integrated circuit using a semiconductor substrate, as well as a TFT.

EMBODIMENTS

Embodiment 1

Crystallization of an amorphous semiconductor film by using the heat treatment apparatus of the present invention will be described with reference to FIG. 9.

Figure 9:
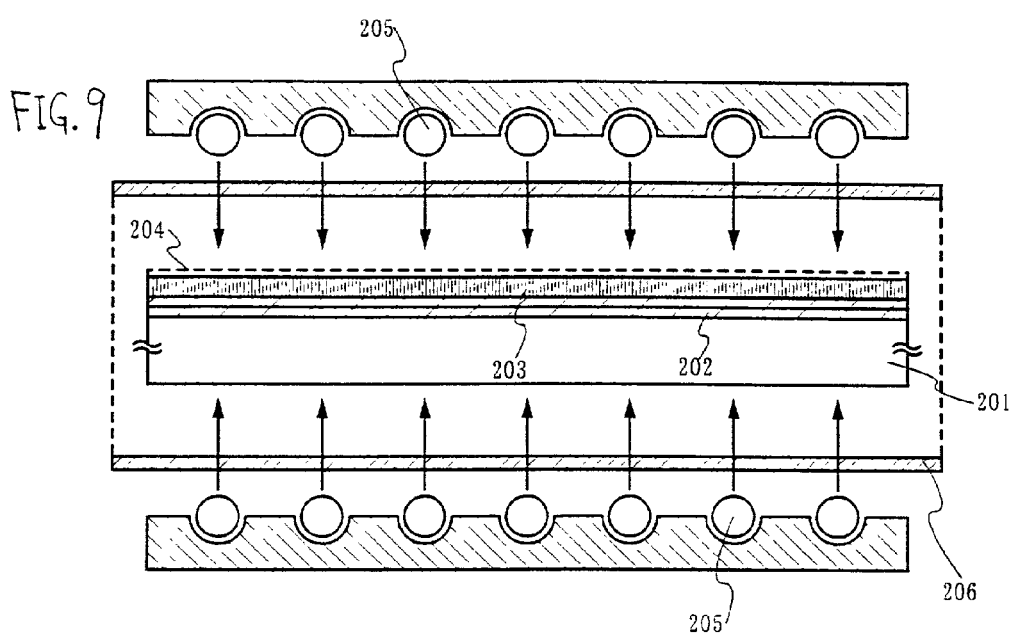
FIG. 9 is a view illustrating a method of heat treatment of a semiconductor film by a heat treatment apparatus of the present invention.

In FIG. 9, a substrate 201 is a light-transmittingt substrate made of aluminoborosilicate glass or barium borosilicate glass. The thickness thereof is 0.3 to 1.1 mm. An amorphous silicon film 203 is formed on the substrate 201 by plasma CVD. A blocking layer 202 is formed such that an impurity element is not mixed in the amorphous silicon film 203 from the substrate 201 by heat treatment or the like. Generally, the blocking layer 202 is formed using an insulating film containing silicon as a component. However, in the present embodiment, a first oxide nitride silicon film is formed of $SiH_4$, $N_2O$, and $NH_3$ by plasma CVD so as to have a thickness of 50 nm, and a second oxide nitride silicon film formed of $SiH_4$ and $N_2O$ by plasma CVD so as to have a thickness of 100 nm, and these films are stacked (laminated) to form the blocking layer 202.

A metal element capable of lowering a heating temperature required for crystallization of silicon is added to the amorphous silicon film 203. Examples of the metal element having such a catalytic function include iron (Fe), nickel (Ni), cobalt (Co), ruthenium (Ru), rhodium (Rh), palladium (Pd), osmium (Os), iridium (Ir), platinum (Pt), copper (Cu), gold (Au), and the like. One kind or a plurality of kinds selected therefrom can be used.

The amorphous silicon film 203 is coated with a nickel acetate solution containing nickel in an amount of 0.1 to 100 ppm, preferably 1 to 5 ppm by weight with a spinner to form a nickel-containing layer 204. In this case, in order to improve compatibility of the solution, the amorphous silicon film 203 is subjected to a surface treatment as follows: a considerably thin oxide film is formed with an ozone-containing aqueous solution; the oxide film thus obtained is etched with a mixed solution of fluoric acid and hydrogen peroxide to form a clean surface; and the surface of the amorphous silicon film 203 is treated with an ozone-containing aqueous solution again to form a considerably thin oxide film. Since the surface of silicon is originally hydrophobic, the surface can be uniformly coated with a nickel acetate solution by forming an oxide film thereon as described above.

The subject substrate in such a state is placed in a reaction tube 206 previously kept under a reduced pressure of 13.3 Pa or lower. Inactive gas heated to 250° C. by the heating unit is introduced into the reaction tube 206, whereby preliminary heating is conducted. Although a preliminary heating time is arbitrary, the subject substrate is kept in that state for 5 minutes, as an example. Alternatively, in the case where the subject substrate is previously heated in a preliminary heating chamber separately provided, a preliminary heating time may be one minute.

Thereafter, the subject substrate is irradiated with pulse light a plurality of times (typically, 2 to 10 times) under the condition of a lighting time of 40 seconds, and a lighting interval of 30 seconds, whereby heat treatment is conducted. Although the temperature of a semiconductor film heated instantaneously with pulse light is not directly measured, irradiation intensity is regulated such that a measurement value of a temperature sensor using a thermocouple becomes 1250° C. Because of the heat treatment, the amorphous silicon film can be crystallized. Thereafter, an introduction path of the inactive gas is switched, and the subject substrate is cooled with the inactive gas cooled to a temperature equal to or lower than a room temperature by the cooling unit.

Furthermore, in the amorphous silicon film manufactured by plasma CVD, hydrogen remains in an amount of about 10 to 30 atomic %. Therefore, the amorphous silicon film is crystallized after the hydrogen is eliminated by heating. As heat treatment for this purpose, it may be possible that the semiconductor film is irradiated with pulse light a plurality of times under the condition of a lighting time of about 0.1 seconds so as to be heated to about 500° C., whereby dehydrogenation is conducted. The dehydrogenation can be promoted under a reduced pressure.

Thus, the amorphous silicon film can be crystallized substantially in a heating time of tens of seconds to several minutes. Even if a glass substrate having a strain point of 660° C. is used, the amorphous silicon film can be crystallized without causing a substrate to be strained.

Embodiment 2

A method of manufacturing a TFT using a crystalline semiconductor film produced as described above will be described with reference to FIGS. 10A to 10D.

Figure 10A:
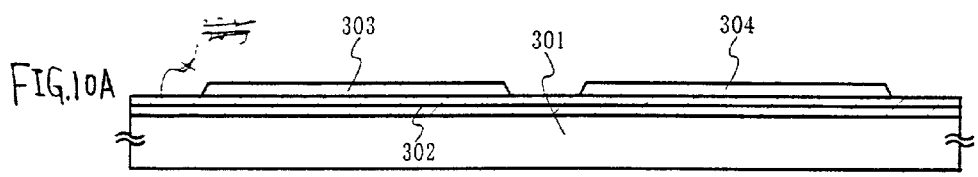
FIGS. 10A to 10D illustrate manufacturing processes of a semiconductor device.

First, as shown in FIG. 10A, crystalline semiconductor films 303 and 304 separated in an island shape are formed on a light-transmitting substrate 301 made of aluminoborosilicate glass or barium borosilicate glass or the like. Furthermore, a first insulating film 302 is formed to have a thickness of 50 to 200 nm between the substrate 301 and the semiconductor films 303 and 304. The first insulating film 302 is made of one of silicon nitride, silicon oxide, and silicon oxide nitride, or a combination thereof.

As an example of the first insulating film 302, a silicon oxide nitride film is formed to have a thickness of 50 to 200 nm, using $SiH_4$ and $N_2O$ by plasma CVD. Alternatively, a double structure may be used in which a silicon oxide nitride film (50 nm) formed of $SiH_4$, $NH_3$, and $N_2O$ by plasma CVD to have a thickness of 50 nm and a silicon oxide nitride film (100 nm) formed of $SiH_4$ and $N_2O$ to have a thickness of 100 nm are stacked on top of each other. Alternatively, a double structure may be used in which a silicon nitride film and a silicon oxide film formed by using tetraethyl orthosilicate (TEOS) are stacked on top of each other.

Then, a second insulating film 305 is formed to have a thickness of 80 nm. The second insulating film 305 is used as a gate insulating film, and formed by plasma CVD or sputtering. A silicon oxide nitride film formed by adding $O_2$ to $SiH_4$ and $N_2O$ is capable of reducing a fixed charge density in the film, so that such a film is suitable for the gate insulating film. Needless to say, the gate insulating film is not limited to a silicon oxide nitride film. An insulating film such as a silicon oxide film or a tantalum oxide film may be used in a single-layer structure or a multi-layer structure.

Figure 10B:
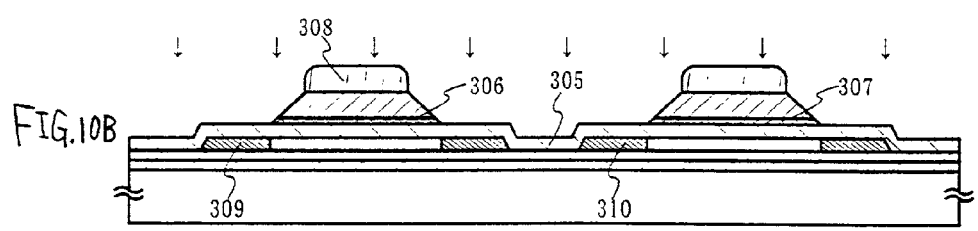

Thereafter, as shown in FIG. 10B, a first conductive film and a second conductive film for forming a gate electrode are formed on the second insulating film 305. The first conductive film is made of tantalum nitride, and the second conductive film is made of tungsten. These conductive films are provided for the purpose of forming a gate electrode, and the respective thicknesses thereof are 30 nm and 300 nm.

Thereafter, a resist pattern 308 is formed for forming a gate electrode by light exposure step. First etching processing is conducted by using the resist pattern 308. An etching method is not particularly limited. However, inductively coupled plasma (ICP) etching is preferably used. Etching is conducted by generating plasma with an RF (13.56 MHz) electric power of 500 W supplied to a coil-type electrode under a pressure of 0.5 to 2 Pa, preferably 1 Pa, using $CF_4$ and $Cl_2$ as etching gas for tungsten and tantalum nitride. At this time, a substrate side (sample stage) is also supplied with an RF (13.56 MHz) electric power of 100 W, whereby a substantially negative self-bias voltage is applied to the substrate side. In the case of mixing $CF_4$ and $Cl_2$, tungsten and tantalum nitride can be etched at the similar rate.

Under the above-mentioned etching conditions, due to the shape of the resist mask and the effect of a bias voltage applied to the substrate side, the end portions of the first and second conductive films can be tapered. The angle of a taper portion is set to be 15° to 45°. Furthermore, in order to etch the first and second conductive films without leaving a residue on the gate insulating film, an etching time may be increased at a rate of about 10% to 20%. The selection ratio of a silicon oxide nitride film to the W film is 2 to 4 (typically 3), so that the surface of the second insulating film 305 exposed by over-etching processing is etched by about 20 to 40 nm. Thus, first-shape electrodes 306 and 307 made of tantalum nitride and tungsten can be formed by the first etching process.

Then, the semiconductor films 303 and 304 are doped with n-type impurities (donor) a by first doping process. A doping method is not particularly limited. However, ion doping or ion implantation is preferably conducted. Ion doping is conducted under the condition of a dose amount of $1 \times 10^{13}$ to $5 \times 10^{14}/cm^2$. As an impurity element providing an n-type, an element belonging to Group 15 of Periodical table, typically, phosphorus (P) or arsenic (As) is used. In this case, the first-shape electrodes 306 and 307 function as masks with respect to a doping element, and by appropriately regulating an acceleration voltage (e.g., 20 to 60 keV), first impurity regions 309 and 310 are formed of an impurity element passing through the second insulating film 305. The concentration of phosphorus (P) in the first impurity regions 309 and 310 is set to be in a range of $1\times10^{20}$ to $1\times10^{21}$/cm$^3$.

Figure 10C:
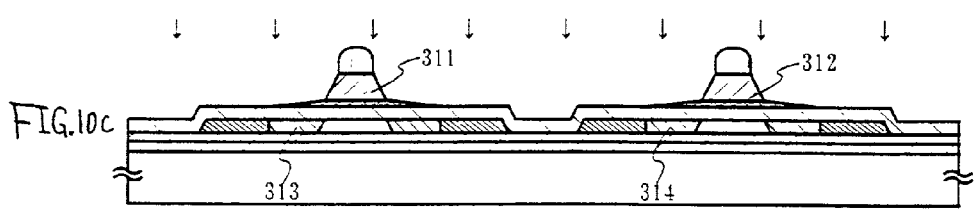

Then, a second etching process is conducted as shown in FIG. 10C. In the second etching process, ICP etching is conducted by generating plasma with an RF (13.56 MHz) electric power of 500 W supplied to a coil-type electrode under a pressure of 1 Pa, using a mixture of $CF_4$, $Cl_2$, and $O_2$ as etching gas. A substrate side (sample stage) is supplied with an RF (13.56 MHz) electric power of 50 W, and a self-bias voltage lower than that of the first etching processing is applied to the substrate side. Under such conditions, the tungsten film is subjected to unisotropic etching to leave the tantalum nitride film (i.e., the first conductive film). Thus, second-shape electrodes 311 and 312 made of tantalum nitride and tungsten are formed by the first etching processing. Due to this etching processing, a portion not covered with tantalum nitride of the second insulating film 305 is etched by about 10 to 30 nm to be made to be thin.

In second doping process, the semiconductor films 303 and 304 are doped with n-type impurities (donor) under the condition of a dose amount smaller than that of the first doping processing and a high acceleration voltage. For example, doping is conducted under the condition of an acceleration voltage of 70 to 120 keV and a dose amount of $1\times10^{13}$/cm$^2$, whereby second impurity regions are formed inside of the first impurity regions. During the second doping process, an impurity element is allowed to pass through the exposed tantalum nitride and added to the semiconductor films under the tantalum nitride. Thus, the second impurity regions 313 and 314 are formed so as to be overlapped with tantalum nitride. The second impurity regions 313 and 314 are varied depending upon the thickness of tantalum nitride, and the peak concentration thereof is varied in a range of $1\times10^{17}$ to $1\times10^{19}$/cm$^3$. The depth distribution of the n-type impurities in these region is not uniform, and the impurity regions are formed with a certain distribution.

Figure 10D:
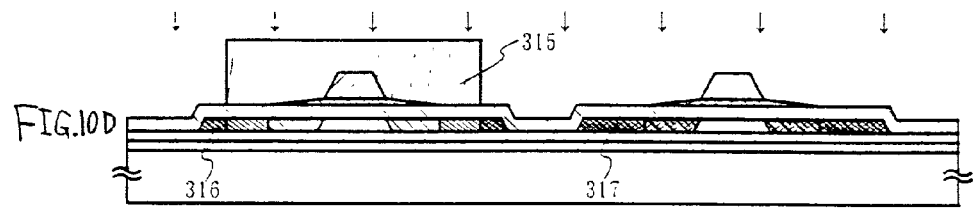

As shown in FIG. 10D, a resist mask 315 is formed. Under this state, the semiconductor films 303 and 304 are doped with p-type impurities (acceptor). Typically, boron (B) is used. The impurity concentration of first p-type impurity added regions 316 and 317 is set to be $2\times10^{20}$ to $2\times10^{21}$/cm$^3$, and boron is added in a concentration of 1.5 to 3 times that of phosphorus contained in the regions, whereby the conductivity of these regions becomes a p-type.

Figure 11:
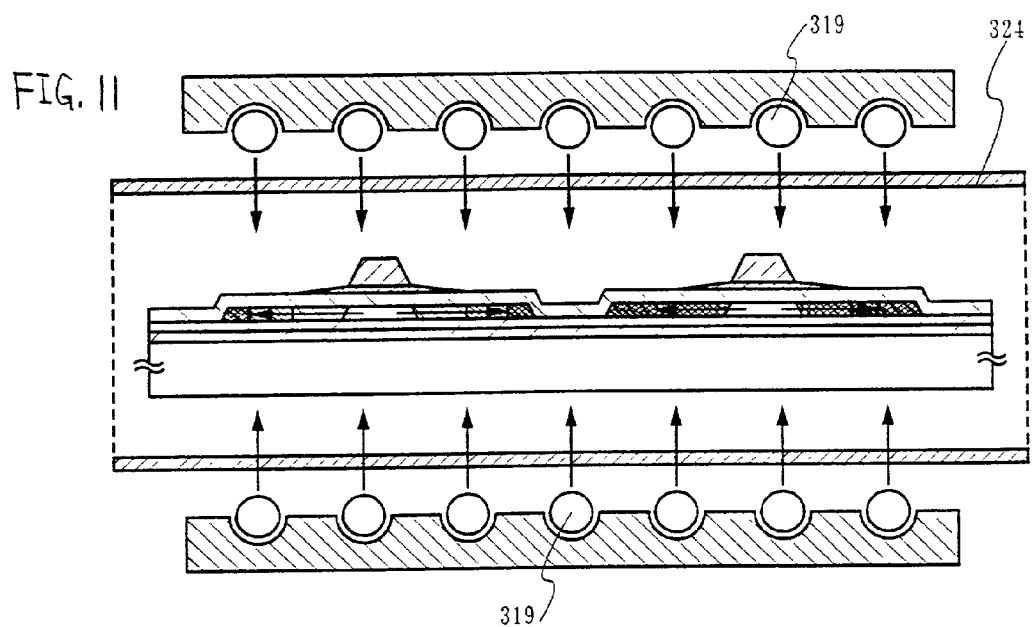
FIG. 11 is a view illustrating a method of heat treatment of a semiconductor film by a heat treatment apparatus of the present invention.

Thereafter, as shown in FIG. 11, heat treatment for activating the added impurities is conducted. The heat treatment is conducted by using the heat treatment apparatus described in the embodiments, in which a subject substrate is introduced into a reaction tube kept under a reduced pressure, and the impurities are activated by irradiation with pulse light. Pulse light is irradiated from one surface or both surfaces of the substrate, using a tungsten halogen lamp 319 as a light source. The heat treatment conducted under the condition that the oxygen concentration is reduced to 10 ppm or less under a reduced pressure can be conducted without oxidizing the surface of the gate electrodes exposed in this stage.

Because of the above-mentioned heat treatment, the impurities are activated, and the catalytic element used for crystallization can be gettered from the regions (i.e., channel formation regions) of the semiconductor films overlapped with the second-shape electrodes to the impurity regions with phosphorus and boron added thereto. Herein, the following is considered: in the regions with boron added thereto, hydrogen is taken in simultaneously during ion doping, and hydrogen is released again by the above-mentioned heat treatment, whereby a large amount of dangling bonds are temporarily generated to function as a gettering site.

Figure 12:
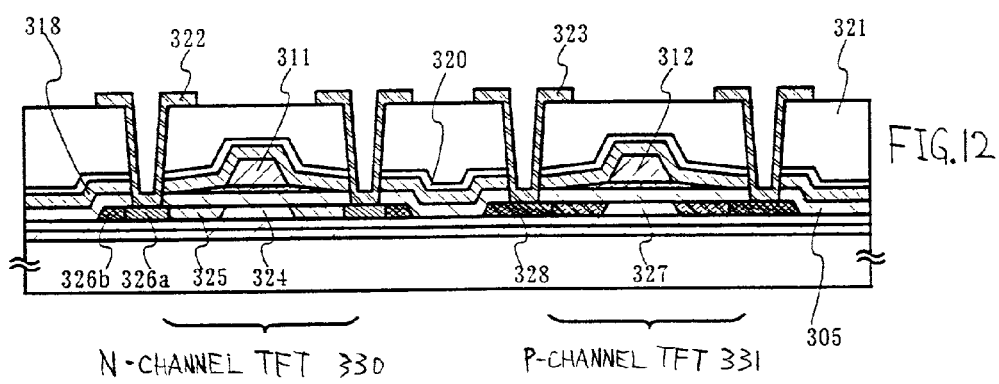
FIG. 12 is a view illustrating a manufacturing process of a semiconductor device.

Thereafter, as shown in FIG. 12, a protective insulating film 318 made of a silicon oxide nitride film or a silicon nitride film is formed to have a thickness of 50 nm by plasma CVD. Heat treatment at 410° C. using a clean oven allows hydrogen to be released from the protective insulating film 318 and the semiconductor films to be hydrogenated, thereby compensating for defects.

An interlayer insulating film 321 is formed of an organic insulating material such as polyimide or acrylic resin so as to level the surface. Needless to say, a silicon oxide formed of TEOS by plasma CVD may be applied.

Then, contact holes reaching the impurity regions of each semiconductor film from the surface of the interlayer insulating film 321 are formed, and wiring is formed using Al, Ti, Ta, and the like. In FIG. 12, reference numerals 322 and 323 become a source line or a drain electrode. Accordingly, an n-channel TFT and p-channel TFT can be formed. Herein, each TFT is shown as a simple substance. However, a CMOS circuit, an NMOS circuit, and a PMOS circuit can be formed by using these TFTs.

Embodiment 3

Figure 13:
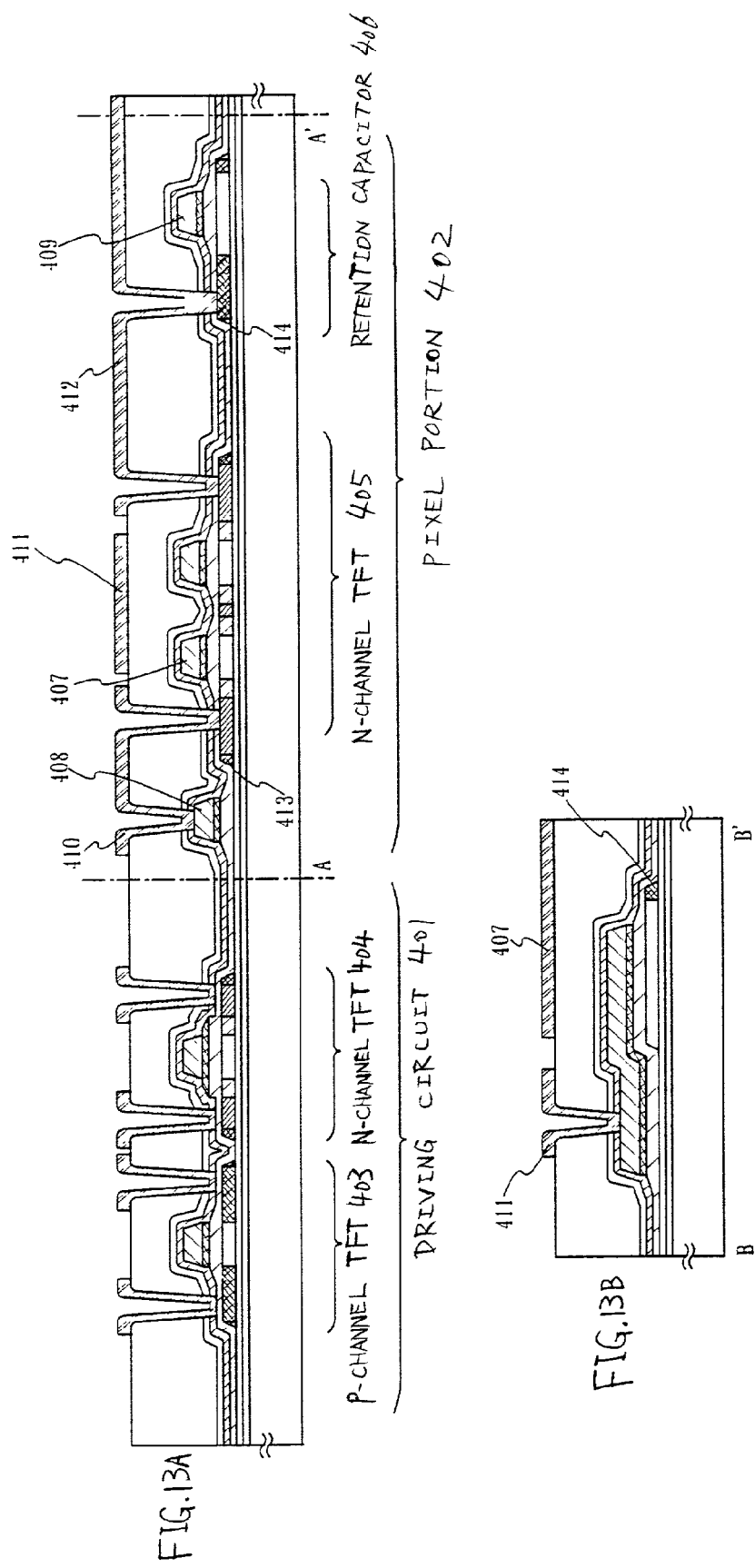
FIGS. 13A and 13B are views illustrating a configuration of a substrate on which a driving circuit and a pixel portion are formed.

FIG. 13A shows a configuration in which a driving circuit 401 composed of a p-channel TFT 403 and an n-channel TFT 404 and a pixel portion 402 composed of an n-channel TFT 405 and a retention capacitor 406 are formed on the same substrate by the processes of Embodiment 2. Although the n-channel TFT 405 has a multi-gate structure, it is manufactured in the same way. In the pixel portion 402, the retention capacitor 406 composed of a semiconductor film 414, a second insulating film, and a capacitor electrode 409 formed by the same processes as those of a gate electrode is formed. Reference numeral 412 denotes a pixel electrode, and 410 denotes a connection electrode connecting a data line 408 to the impurity region of a semiconductor film 413. Furthermore, reference numeral 411 denotes a gate line, which is connected to a third-shape electrode 407 functioning as a gate electrode (not shown). The third-shape electrode 407 is formed by etching tantalum nitride of the second-shape electrode.

Figure 14:
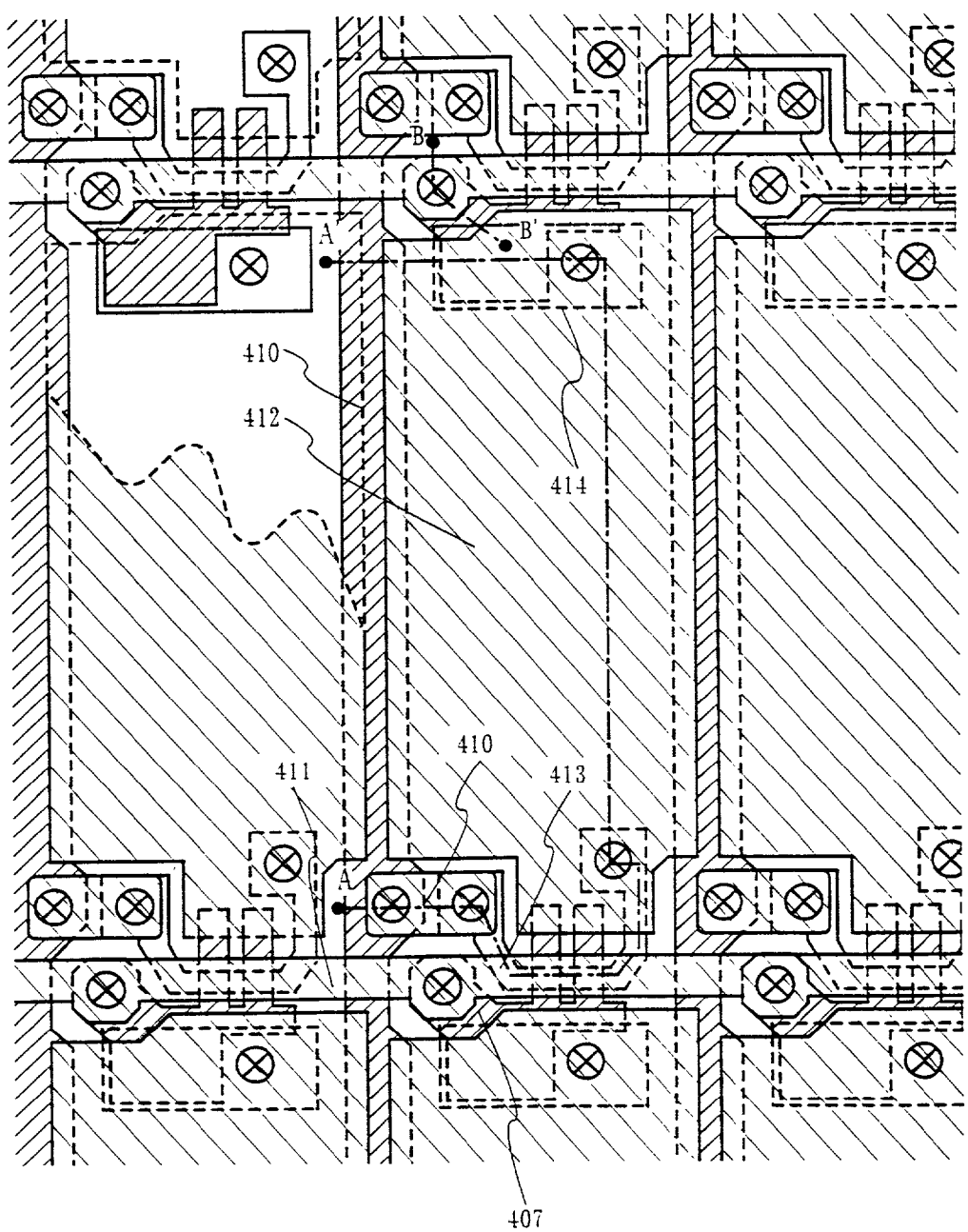
FIG. 14 is a view illustrating a configuration of a pixel portion.

Various functioning circuits such as a shift register, a level shifter, a latch, and a buffer circuit can be formed by using the p-channel TFT 403 and the n-channel TFT 404 of the driving circuit 401. A cross-sectional structure taken along a line A–A' in FIG. 13A corresponds to a cross-sectional structure taken along a line A–A' in a top view of a pixel shown in FIG. 14. A cross-sectional structure taken along a line B–B' shown in FIG. 13B corresponds to a cross-sectional structure taken along a line B–B' in a top view of a pixel shown in FIG. 14.

Figure 15:
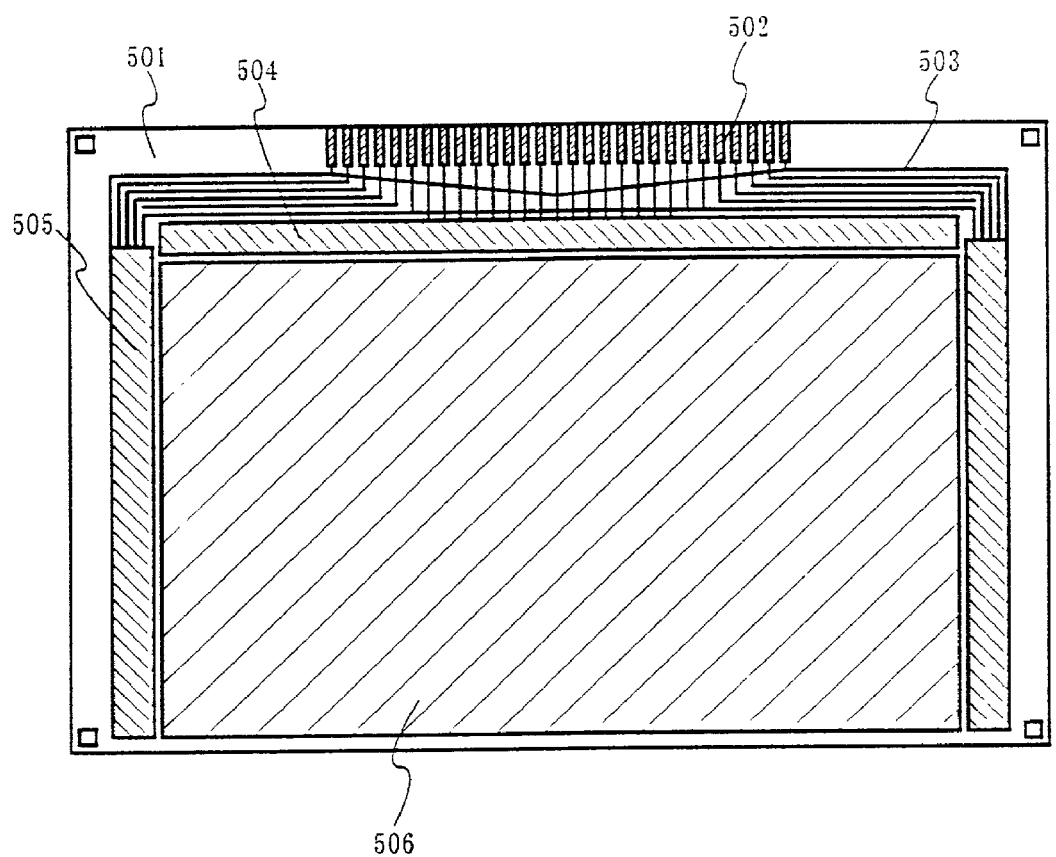
FIG. 15 is a view illustrating an outer appearance of an element substrate of a display apparatus.

A liquid crystal display device and a light-emitting apparatus in which a pixel portion is formed of a light-emitting element can be formed by using the above-mentioned substrate. FIG. 15 shows an outer appearance of a substrate in which a driving circuit and a pixel portion are formed of TFTs. On a substrate 501, a pixel portion 506 and driving circuits 504 and 505 are formed. Furthermore, an input terminal 502 is formed at one end of the substrate, and wiring 503 connected to each driving circuit is formed.

In order to manufacture a liquid crystal display device, a counter substrate is attached to the above-mentioned substrate using a sealing agent with a gap interposed therebetween, and liquid crystal is injected in the gap. In the case of a light-emitting apparatus, an organic light-emitting element is formed in a pixel portion. Thus, various semiconductor devices can be manufactured in the present embodiment.

Embodiment 4

As shown in Embodiment 1, a method of crystallization by adding a metal element having a catalytic function over the entire surface of an amorphous semiconductor film can be conducted by using the heat treatment apparatus of the present invention. More preferably, the metal element is removed by gettering.

FIGS. 16A to 16C illustrate an embodiment of the above-mentioned method. More specifically, FIGS. 16A to 16C illustrate a method in which a metal element having a catalytic function is added to the entire surface of an amorphous semiconductor film, followed by crystallization, and gettering is conducted. In FIG. 16A, a substrate 601 can be made of barium borosilicate glass, aluminoborosilicate glass, or quartz. On the surface of the substrate 601, an inorganic insulating film is formed to have a thickness of 10 to 200 nm as a blocking layer 602. The blocking layer 602 is provided for the purpose of preventing alkali metal contained in a glass substrate from diffusing to a semiconductor film to be formed on the blocking layer 602. In the case where a substrate is made of quartz, the blocking layer 602 may be omitted.

A semiconductor film 603 having an amorphous structure formed on the blocking layer 602 is made of a semiconductor material mainly containing silicon. Typically, an amorphous silicon film or an amorphous silicon germanium film is used as the semiconductor film 603, and the semiconductor film 603 is formed to have a thickness of 10 to 100 nm by plasma CVD, low-pressure CVD, or sputtering. In order to obtain crystal of good quality, the concentration of impurities such as oxygen, nitrogen, and carbon contained in the semiconductor film 603 having an amorphous structure is required to be reduced as much as possible, and it is desirable to use a high-purity material gas and a CVD apparatus designed for an ultra-high vacuum state.

Thereafter, a metal element having a catalytic function of accelerating crystallization is added to the surface of the semiconductor film 603 having an amorphous structure. The surface of the semiconductor film 603 is coated with a nickel acetate solution containing nickel in an amount of 1 to 10 ppm by weight with a spinner to form a catalyst-containing layer 604. In this case, in order to enhance compatibility of the solution, the surface of the semiconductor film 603 having an amorphous structure is treated as follows: a very thin oxide film is formed of an ozone-containing aqueous solution; the oxide film is etched with a mixed solution of fluoric acid and hydrogen peroxide to form a clean surface; and the resultant surface is treated with an ozone-containing aqueous solution again to form a very thin oxide film. Since the surface of a semiconductor film such as silicon is hydrophobic, the surface can be uniformly coated with a nickel acetate solution by forming an oxide film thereon as described above.

The method of forming the catalyst-containing layer 604 is not limited to the above, and may be formed by sputtering, vapor deposition, plasma processing, or the like.

Thereafter, a crystalline semiconductor film 605 as shown in FIG. 16B can be formed by irradiation with pulse light under a reduced pressure of 13.3 to $1.33 \times 10^4$ Pa, using the heat treatment apparatus of the present invention in the same way as in Embodiment 1.

In order to enhance a crystallization ratio (ratio of a crystal component in the entire volume of the film), and correct defects remaining in crystal grains, it is also effective to irradiate the crystalline semiconductor film 605 with laser light. As a laser, an excimer laser with a wavelength of 400 nm or less, the second harmonic or the third harmonic of a YAG laser is used. In any case, laser processing may be conducted with respect to the crystalline semiconductor film 605 under the condition that pulse laser light with a repeating frequency of about 10 to 1000 Hz is used, the laser light is condensed to 100 to 400 mJ/cm$^2$ by an optical system with an overlap ratio of 90 to 95%.

In the crystalline semiconductor film 605 thus obtained, a metal element (herein, nickel) remains. Although the metal element is not uniformly distributed in the film, it remains in a concentration exceeding $1 \times 10^{19}$/cm$^3$ on average. Needless to say, even in such a state, various kinds of semiconductor devices such as a TFT can be formed. More preferably, the metal element is removed by gettering.

FIG. 16B shows a process of adding a rare gas element, or a rare gas element and an impurity element of one conductive type to the crystalline semiconductor film 605 by ion doping so as to form gettering sites 608. On the surface of the crystalline semiconductor film 605, a silicon oxide film 606 for a mask is formed to have a thickness of 100 to 200 nm, and a rare gas element, or a rare gas element and an impurity element of one conductive type is added to regions where openings 607 are provided and the crystalline semiconductor film 605 is exposed. The concentration of the rare gas element in the crystalline semiconductor film 605 is set to be $1 \times 10^{19}$ to $1 \times 10^{21}$/cm$^3$.

The above-mentioned doping is conducted by adding phosphine (PH$_3$) or diborane (B$_2$H$_6$) diluted to 1 to 10%, preferably 3 to 5% with hydrogen, and thereafter, adding a rare gas element. Alternatively, PH$_3$ or B$_2$H$_6$ diluted to 1 to 10%, preferably 3 to 5% with rare gas is added. However, more preferably, only a rare gas element is added by ion doping, thereby forming gettering sites.

As the rare gas element, one kind or a plurality of kinds of elements selected from helium (He), neon (Ne), argon (Ar), krypton (Kr), and xenon (Xe) is used. Argon is typically used. The present invention is characterized in that, in order to form gettering sites, these inactive gases are used as an ion source, and implanted into the semiconductor film by ion doping or ion implantation. Implantation of the ions of these inactive gases have two effects. One effect is to form dangling bonds by implantation to give a strain to the semiconductor film. The other effect is to implant the ions between lattices of the semiconductor film to give a strain. Implantation of the ions of these inert gases can have both the effects. However, the latter effect is remarkably exhibited when an element is used which has a radius of an atom larger than that of silicon, such as argon (Ar), krypton (Kr), and xenon (Xe).

When heat treatment is conducted at 450° C. to 800° C. for 1 to 24 hours (e.g., at 550° C. for 14 hours) in a nitrogen atmosphere, a metal element can be segregated in the gettering sites 608. Alternatively, irradiation with pulse light can be conducted under a reduced pressure of 13.3 to $1.33 \times 10^4$ Pa, using the heat treatment apparatus of the present invention in the same way as in Embodiment 1. In this case, in order to effectively achieve gettering, the temperature of the semiconductor film to be heated with pulse light is set so as not to eliminate a strain by alleviating lattices.

Thereafter, when the gettering sites 608 are removed by etching, a crystalline semiconductor film 609 with a concentration of the metal element reduced is obtained as shown in FIG. 16C. In the crystalline semiconductor film 609 thus obtained, bar-shaped or needle-shaped crystal gathers, and each crystal grain is grown with a particular directivity when seen macroscopically. In particular, in the case where gettering sites are formed by using only a rare gas element, the crystalline semiconductor film 609 is used as it is, whereby a TFT shown in Embodiment 2 or 3 can be formed.

Embodiment 5

A method of selectively forming an element for accelerating crystallization of a semiconductor film will be described with reference to FIGS. 17A to 17D. In FIG. 17A, in the case where a glass substrate is used as the substrate 601, the blocking layer 602 is formed. The semiconductor film 603 having an amorphous structure is formed in the same way as in Embodiment 1.

A silicon oxide film 610 having a thickness of 100 to 200 nm is formed on the semiconductor film 603 having an amorphous structure. There is no particular limit to a method of manufacturing a silicon oxide film. For example, tetraethyl orthosilicate (TEOS) and $O_2$ are mixed, and discharge is conducted under the condition of a reaction pressure of 40 Pa, a substrate temperature of 300° C. to 400° C., and a high-frequency (13.56 MHz) electric power density of 0.5 to 0.8 W/cm$^2$, whereby a silicon oxide film is formed.

Next, openings 611 are formed in the silicon oxide film 610, and the resultant silicon oxide film 610 is coated with nickel acetate solution containing nickel in an amount of 1 to 10 ppm by weight. Because of this, a catalyst metal-containing layer 612 is formed. The catalyst metal-containing layer 612 contacts the semiconductor film 603 only in bottom portions of the openings 611.

The crystalline semiconductor film 605 shown in FIG. 17B can be formed by irradiation with pulse light under a reduced pressure of 1 to 200 Pa, using the heat treatment apparatus of the present invention in the same way as in Embodiment 1. In this case, silicide is formed in a portion of the semiconductor film with which a metal element to be a catalyst is in contact, and crystallization is effected in a direction parallel to the surface of the substrate using the silicide as a core. In a crystalline silicon film 614 thus obtained, bar-shaped or needle-shaped crystal gathers, and each crystal grain is grown with a particular directivity when seen macroscopically.

Then, a rare gas element, or a rare gas element and an impurity element of one conductive type is added by ion doping, utilizing the openings 611, whereby gettering sites 615 are formed. When heat treatment is conducted at 450° C. to 800° C. for 1 to 24 hours (e.g., at 550° C. for 14 hours) in a nitrogen atmosphere, a metal element can be segregated in the gettering sites 615. Alternatively, irradiation with pulse light can be conducted under a reduced pressure of 13.3 to 1.33×10$^4$ Pa, using the heat treatment apparatus of the present invention in the same way as in Embodiment 1. In this case, in order to effectively achieve gettering, the temperature of the semiconductor film to be heated with pulse light is set so as not to eliminate a strain by alleviating lattices.

Thereafter, when the gettering sites are removed by etching, a crystalline semiconductor film 616 with the concentration of a metal element reduced is obtained as shown in FIG. 17D. The crystalline semiconductor film 609 is used as it is, whereby a TFT shown in Embodiment 2 or 3 can be formed.

Embodiment 6

Gettering using a rare gas element as shown in Embodiment 4 or 5 can have a similar effect by adding a rare gas element to an impurity region for forming a source/drain region in the course of manufacturing a TFT shown in Embodiment 2. More specifically, by conducting heat treatment for activation so as to decrease a resistance of the impurity region, the concentration of the metal element remaining in a channel formation region can be reduced.

Embodiment 7

The various semiconductor devices can be formed by using the present invention. As the semiconductor devices of the present invention there are: a video camera; a digital camera; a goggle type display (head mounted display); a car navigation system; a sound reproduction device (a car audio stereo and an audio set and so forth); a notebook type personal computer; a game apparatus; a portable information terminal (such as a mobile computer, a portable telephone, a portable game machine, or an electronic book); and an image playback device equipped with a recording medium. Specific examples of those electronic equipments are shown in FIGS. 18A to 19C.

Figure 18A:
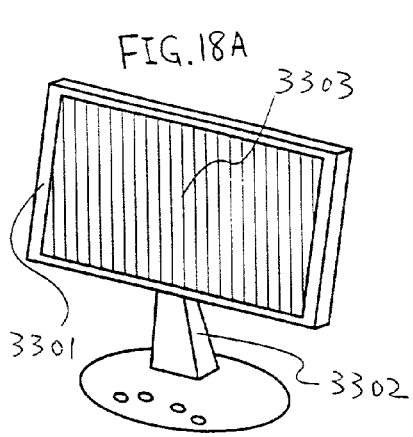
FIGS. 18A to 18F show exemplary semiconductor devices.

FIG. 18A shows a monitor of a desktop personal computer containing a casing 3301, a support stand 3302, and a display portion 3303. The light-emitting device of the present invention can be used as the display portion 3303. By the present invention, the monitor can be manufactured by forming the display portion 3303 and other integrated circuit.

Figure 18B:
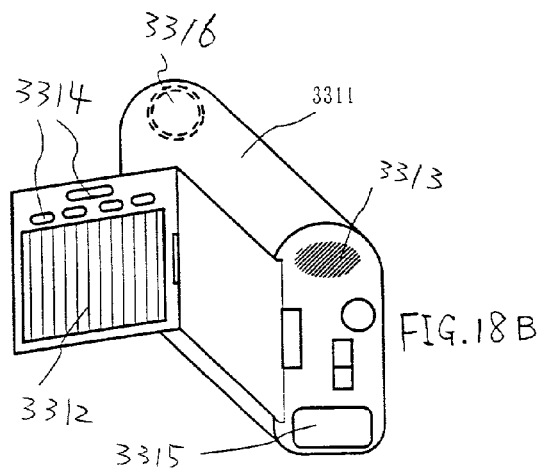

FIG. 18B shows a video camera, and contains a main body 3311, a display portion 3312, a sound input portion 3313, operation switches 3314, a battery 3315, and an image receiving portion 3316. By the present invention, the video camera can be manufactured by forming the display portion 3312 and other integrated circuit.

Figure 18C:
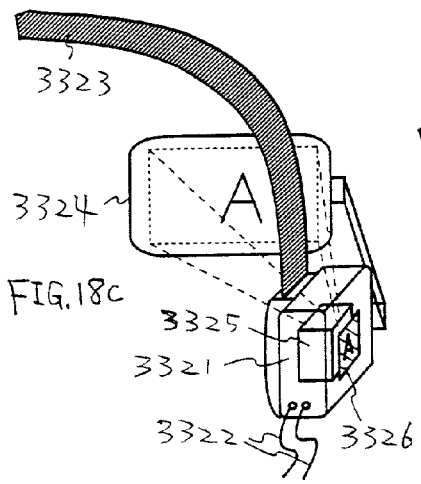

FIG. 18C shows a part of a head mounted display device (right handed side), and contains a main boy 3321, a signal cable 3322, a head fixation band 3323, a display portion 3324, an optical system 3325 and a display device 3326. By the present invention, the head mounted display device can be manufactured by forming the display portion 3326 and other integrated circuit.

Figure 18D:
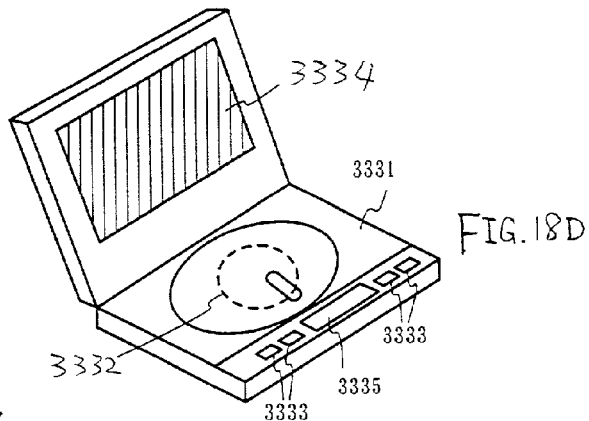

FIG. 18D is an image playback device equipped with a recording medium (specifically, a DVD playback device), and contains a main body 3331, a recording medium (such as a DVD and so forth) 3332, operation switches 3333, a display portion (a) 3334, and a display portion (b) 3335. The display portion (a) 3334 is mainly used for displaying image information. The display portion (b) 3335 is mainly used for displaying character information. By the present invention, the image playback device can be manufactured by forming the display portion (a) 3334 and (b) 3335 and other integrated circuit. Note that the image playback device equipped with the recording medium includes devices such as domestic game machines.

Figure 18E:
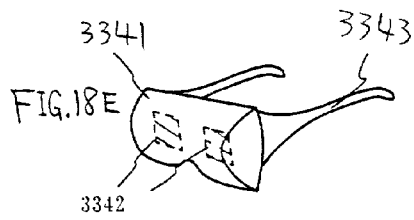

FIG. 18E shows a goggle type display device (a head mounted display device), and contains a main body 3341, a display portion 3342, and an arm portion 3343. By the present invention, the goggle type display device can be manufactured by forming the display portion 3342 and other integrated circuit.

Figure 18F:
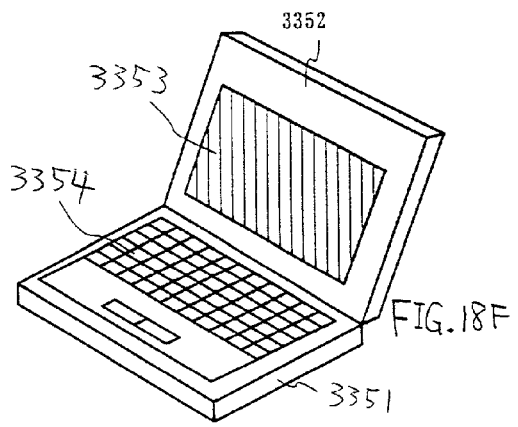

FIG. 18F is a laptop type personal computer, and contains a main body 3351, a casing 3352, a display portion 3353, and a keyboard 3354. By the present invention, the laptop type personal computer can be manufactured by forming the display portion 3353 and other integrated circuit.

Figure 19A:
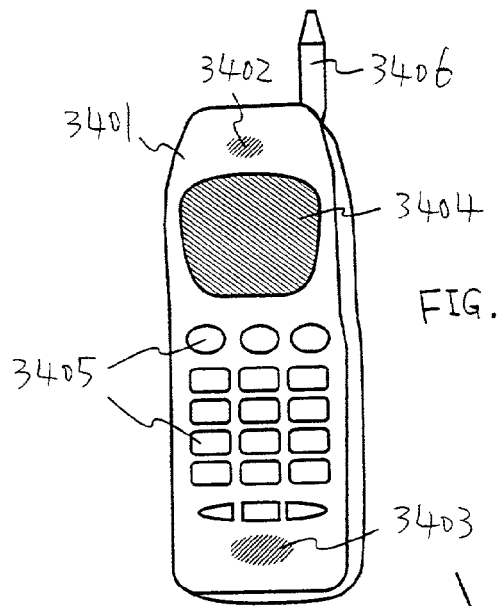
FIGS. 19A to 19C show exemplary semiconductor devices.

FIG. 19A shows a portable telephone, and contains a main body 3401, a sound output portion 3402, a sound input portion 3403, a display portion 3404, operation switches 3405, and an antenna 3406. By the present invention, the portable telephone can be manufactured by forming the display portion 3404 and other integrated circuit.

Figure 19B:
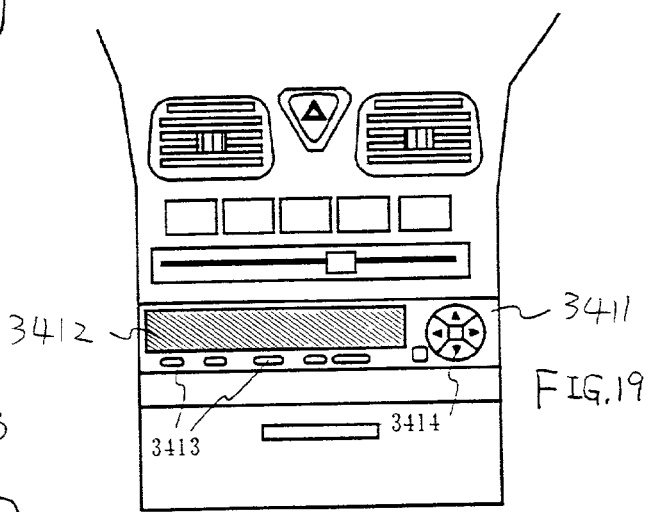

FIG. 19B shows a sound reproduction device, in a concrete term, a car audio stereo, and contains a main body 3411, a display portion 3412, and operation switches 3413 and 3414. By the present invention, the sound reproduction device can be manufactured by forming the display portion 3412 and other integrated circuit. Further, a car mounting audio stereo is shown in this embodiment, but a portable type or a domestic type sound reproduction device may also be used.

Figure 19C:
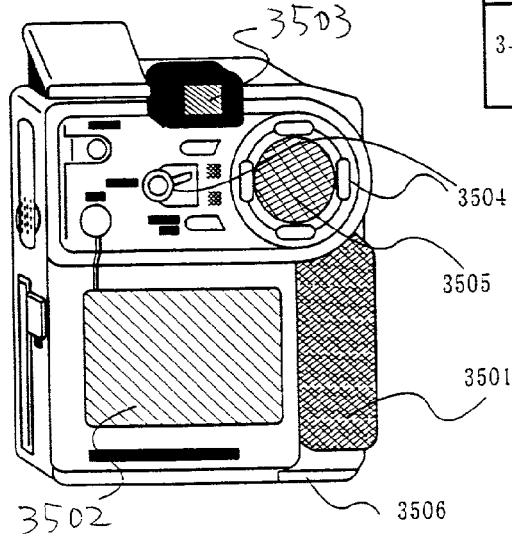

FIG. 19C shows a digital camera, and contains a main body 3501, a display portion (A) 3502. an eye piece portion 3503, and an operation switches 3504, a display portion (B) 3505, a battery 3506. By the present invention, the digital camera can be manufactured by forming the display portion (A) 3502 and (B) 3505 and other integrated circuit.

As described above, the application range of this invention is extremely wide, and it may be used for electric devices in various fields. Further, the electronic device of this embodiment may be obtained by freely combining any of the structures shown in Embodiments 1 to 6.

As described above, the heat treatment apparatus of the present invention allows heat treatment to be conducted for the purpose of crystallizing an amorphous semiconductor film in a short period of time and activating an impurity element added to a semiconductor film.

Furthermore, by setting each lighting time of a light source to be 0.1 to 60 seconds, preferably 0.1 to 20 seconds, irradiating light from the light source a plurality of times, and setting a retention time of the highest temperature of a semiconductor substrate to be 0.5 to 5 seconds, even if a glass substrate having low heat resistance is used, a heat treatment effect can be enhanced, and a layer with low heat resistance formed on a semiconductor substrate can be prevented from being damaged.

Furthermore, by conducting the heat treatment under a reduced pressure, the concentration of oxygen in an atmosphere is reduced, and oxidation of the surface of a semiconductor film is suppressed to accelerate activation of impurities, whereby heat treatment with high reproducibility can be conducted.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of manufacturing a semiconductor device comprising:
    disposing a substrate in a reaction tube;
    heating the substrate in a first stage with a plurality of first light pulses, and
    heating the substrate in a second stage, after the first stage, with a plurality of second light pulses,
    wherein each first light pulse has a cycle of one second or shorter,
    wherein each second light pulse has a cycle of one second or longer,
    wherein said each first light pulse and said each second light pulse are formed by switching on and off a lamp light source, and
    wherein the lamp light source is provided outside of the reaction tube.

2. A method according to claim 1, wherein the lamp light source is at least one selected from the group consisting of a halogen lamp, a metal halide lamp, a high-pressure mercury lamp, a high-pressure sodium lamp, and a xenon lamp.

3. A method according to claim 1 wherein the semiconductor device is a video camera.

4. A method according to claim 1 wherein the semiconductor device is a digital camera.

5. A method according to claim 1 wherein the semiconductor device is a goggle type display.

6. A method according to claim 1 wherein the semiconductor device is a car navigation system.

7. A method according to claim 1 wherein the semiconductor device is a sound reproduction device.

8. A method according to claim 1 wherein the semiconductor device is a personal computer.

9. A method according to claim 1 wherein the semiconductor device is a game apparatus.

10. A method according to claim 1 wherein the semiconductor device is a portable information terminal.

11. A method according to claim 1 wherein the semiconductor device is an image playback device.

12. A method of manufacturing a semiconductor device comprising:
    disposing a substrate in a reaction tube;
    supplying heated gas to the reaction tube;
    heating the substrate in a second stage, after the first stage, with a plurality of second light pulses,
    wherein each first light pulse has a cycle of one second or shorter,
    wherein each second light pulse has a cycle of one second or longer,
    wherein each first light pulse and said each second light pulse are formed by switching on and off a lamp light source, and
    wherein the lamp light source is provided outside of the reaction tube.

13. A method according to claim 12, wherein the lamp light source is at least one selected from the group consisting of a halogen lamp, a metal halide lamp, a high-pressure mercury lamp, a high-pressure sodium lamp, and a xenon lamp.

14. A method according to claim 12 wherein the semiconductor device is a digital camera.

15. A method according to claim 12 wherein the semiconductor device is a digital camera.

16. A method according to claim 12 wherein the semiconductor device is a goggle type display.

17. A method according to claim 12 wherein the semiconductor device is a car navigation system.

18. A method according to claim 12 wherein the semiconductor device is a sound reproduction device.

19. A method according to claim 12 wherein the semiconductor device is a personal computer.

20. A method according to claim 12 wherein the semiconductor device is a game apparatus.

21. A method according to claim 12 wherein the semiconductor device is a portable information terminal.

22. A method according to claim 12 wherein the semiconductor device is an image playback device.

23. A method of manufacturing a semiconductor device comprising:
    disposing a substrate in a reaction tube;
    keeping the reaction tube under reduced pressure;
    heating the substrate in a first stage with a plurality of first light pulses; and
    heating the substrate in a second stage, after the first stage, with a plurality of second light pulses,
    wherein each first light pulse has a cycle of one second or shorter,
    wherein each second light pulse has a cycle of one second or longer, wherein said each first light pulse and said each second light pulse are formed by switching on and off a lamp light source, and wherein the lamp light source is provided outside of the reaction tube.

24. A method according to claim 23, wherein the light source is at least one selected from the group consisting of a halogen lamp, a metal halide lamp, a high-pressure mercury lamp, a high-pressure sodium lamp, and a xenon lamp.

25. A method according to claim 23 wherein the semiconductor device is a video camera.

26. A method according to claim 23 wherein the semiconductor device is a digital camera.

27. A method according to claim 23 wherein the semiconductor device is a goggle type display.

28. A method according to claim 23 wherein the semiconductor device is a car navigation system.

29. A method according to claim 23 wherein the semiconductor device is a sound reproduction device.

30. A method according to claim 23 wherein the semiconductor device is a personal computer.

31. A method according to claim 23 wherein the semiconductor device is a game apparatus.

32. A method according to claim 23 wherein the semiconductor device is a portable information terminal.

33. A method according to claim 23 wherein the semiconductor device is an image playback device.

34. A method of manufacturing a semiconductor device comprising:
disposing a substrate in a reaction tube;
supplying heated gas in the reaction tube while keeping the reaction tube under a reduced pressure;
heating the substrate in a first stage with a plurality of first light pulses; and
heating the substrate in a second stage, after the first stage, with a plurality of second light pulses,
wherein each light pulse has a cycle of one second or shorter,
wherein each second light pulse has a cycle of one second or longer,
wherein said each first light pulse and said each second light pulse are formed by switching on and off a lamp light source, and
wherein the lamp light source is provided outside of the reaction tube.

35. A method according to claim 34, wherein the lamp light source is at least one selected from the group consisting of a halogen lamp, a metal halide lamp, a high-pressure mercury lamp, a high-pressure sodium lamp, and a xenon lamp.

36. A method according to claim 34 wherein the semiconductor device is a video camera.

37. A method according to claim 34 wherein the semiconductor device is a digital camera.

38. A method according to claim 34 wherein the semiconductor device is a goggle type display.

39. A method according to claim 34 wherein the semiconductor device is a car navigation system.

40. A method according to claim 34 wherein the semiconductor device is a sound reproduction device.

41. A method according to claim 34 wherein the semiconductor device is a personal computer.

42. A method according to claim 34 wherein the semiconductor device is a game apparatus.

43. A method according to claim 34 wherein the semiconductor device is a portable information terminal.

44. A method according to claim 34 wherein the semiconductor device is an image playback device.

45. A method of manufacturing a semiconductor device, comprising:
disposing a semiconductor film, in which an impurity region of one conductive type is formed, in a reaction tube;
heating the semiconductor film in a first stage with a plurality of first light pulses; and
heating the semiconductor film in a second stage, after the first stage, with a plurality of second light pulses,
wherein each first light has a cycle of one second or shorter,
wherein each second light pulse has a cycle of one second or longer,
wherein said each first light pulse and said each second light pulse are formed by switching on and off a lamp light source, and
wherein the lamp light source is provided outside of the reaction tube.

46. A method according to claim 45, wherein the lamp light source is at least one selected from the group consistinf of a halogen lamp, a metal halide lamp, a high-pressure mercury lamp, a high-pressure sodium lamp, and a xenon lamp.

47. A method according to claim 45 wherein the semiconductor device is a video camera.

48. A method according to claim 45 wherein the semiconductor device is a digital camera.

49. A method according to claim 45 wherein the semiconductor device is a goggle type display.

50. A method according to claim 45 wherein the semiconductor device is a car navigation system.

51. A method according to claim 45 wherein the semiconductor device is a sound reproduction device.

52. A method according to claim 45 wherein the semiconductor device is a personal computer.

53. A method according to claim 45 wherein the semiconductor device is a game apparatus.

54. A method according to claim 45 wherein the semiconductor device is a portable information terminal.

55. A method according to claim 45 wherein the semiconductor device is an image playback device.

56. A method for manufacturing a semiconductor device, comprising:
disposing a semiconductor film, in which an impurity region of one conductive type is formed, in a reaction tube;
supplying heated gas into the reaction tube;
heating the semiconductor film in a first stage with a plurality of first light pulses; and
heating the semiconductor film in a second stage, after the first stage, with a plurality of second light pulses,
wherein each first pulse has a cycle of one second or shorter,
wherein each second light pulse has a cycle of one second or longer,
wherein said each first light pulse and said second light pulse are formed by switching on and off a lamp light source, and
wherein the lamp light source is provided outside of the reaction tube.

57. A method according to claim 56, wherein the lamp light source is at least one selected from the group consisting of a halogen lamp, a metal halide lamp, a high-pressure mercury lamp, a high-pressure sodium lamp, and a xenon lamp.

58. A method according to claim 56 wherein the semiconductor device is a video camera.

59. A method according to claim 56 wherein the semiconductor device is a digital camera.

60. A method according to claim 56 wherein the semiconductor device is a goggle type display.

61. A method according to claim 56 wherein the semiconductor device is a car navigation system.

62. A method according to claim 56 wherein the semiconductor device is a sound reproduction device.

63. A method according to claim 56 wherein the semiconductor device is a personal computer.

64. A method according to claim 56 wherein the semiconductor device is a game apparatus.

65. A method according to claim 56 wherein the semiconductor device is a portable information terminal.

66. A method according to claim 56 wherein the semiconductor device is an image playback device.

67. A method of manufacturing a semiconductor device, comprising:
   disposing a semiconductor film, in which an impurity region of one conductive type is formed, in a reaction tube;
   keeping the reaction tube under a reduced pressure;
   heating the semiconductor film in a first stage with a plurality of first light pulses; and
   heating the semiconductor film in a second stage, after the first stage, with a plurality of second light pulses,
   wherein each first light pulse has a cycle of one second or shorter,
   wherein each second light pulse has a cycle of one second or longer,
   wherein said each first light pulse and said each second light pulse are formed by switching on and off a lamp light source, and
   wherein the lamp light source is provided outside of the reaction tube.

68. A method according to claim 67, wherein the lamp light source is at least one selected from the group consisting of a halogen lamp, a metal halide lamp, a high-pressure mercury lamp, a high-pressure sodium lamp, and a xenon lamp.

69. A method according to claim 67 wherein the semiconductor device is a video camera.

70. A method according to claim 67 wherein the semiconductor device is a digital camera.

71. A method according to claim 67 wherein the semiconductor device is a goggle type display.

72. A method according to claim 67 wherein the semiconductor device is a car navigation system.

73. A method according to claim 67 wherein the semiconductor device is a sound reproduction device.

74. A method according to claim 67 wherein the semiconductor device is a personal computer.

75. A method according to claim 67 wherein the semiconductor device is a game apparatus.

76. A method according to claim 67 wherein the semiconductor device is a portable information terminal.

77. A method according to claim 67 wherein the semiconductor device is an image playback device.

78. A method of manufacturing a semiconductor device, comprising:
   disposing a semiconductor film, in which an impurity region of one conductive type is formed, in a reaction tube;
   keeping the reaction tube under a reduced pressure;
   supplying heated gas into the reaction tube; and
   heating the semiconductor film in a first stage with a plurality of first light pulses; and
   heating the semiconductor film in a second stage, after the first stage, with a plurality of second light pulses,
   wherein each first light pulse has a cycle of one second or shorter,
   wherein each second light pulse has a cycle of one second or longer,
   wherein said each first light pulse and said each second light pulse are formed by switching on and off a lamp light source, and
   wherein the lamp light source is provided outside of the reaction tube.

79. A method according to claim 78, wherein the lamp light source is at least one selected from the group consisting of a halogen lamp, a metal halide lamp, a high-pressure mercury lamp, a high-pressure sodium lamp, and a xenon lamp.

80. A method according to claim 67 wherein the semiconductor device is a video camera.

81. A method according to claim 67 wherein the semiconductor device is a digital camera.

82. A method according to claim 67 wherein the semiconductor device is a goggle type display.

83. A method according to claim 67 wherein the semiconductor device is a car navigation system.

84. A method according to claim 67 wherein the semiconductor device is a sound reproductione device.

85. A method according to claim 67 wherein the semiconductor device is a personal computer.

86. A method according to claim 67 wherein the semiconductor device is a game apparatus.

87. A method according to claim 67 wherein the semiconductor device is a portable information terminal.

88. A method according to claim 67 wherein the semiconductor device is an image playback device.

* * * * *